US012764958B2

(12) United States Patent
Kim et al.

(10) Patent No.: US 12,764,958 B2
(45) Date of Patent: Oct. 13, 2026

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Hyunji Kim, Suwon-si (KR); Sehee Jang, Suwon-si (KR); Jeehoon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 293 days.

(21) Appl. No.: 18/605,147

(22) Filed: Mar. 14, 2024

(65) Prior Publication Data

US 2025/0071993 A1 Feb. 27, 2025

(30) Foreign Application Priority Data

Aug. 23, 2023 (KR) ........................ 10-2023-0110269

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 41/27; H10B 43/27; H10B 43/10; H10B 43/50
See application file for complete search history.

(56) References Cited

U.S. PATENT DOCUMENTS

| | | | |
|---|---|---|---|
| 9,577,085 B2 | 2/2017 | Lee | |
| 9,853,048 B2 | 12/2017 | Kim et al. | |
| 10,211,215 B1 | 2/2019 | Ishii et al. | |
| 10,553,598 B2 | 2/2020 | Jung | |
| 10,586,804 B2 | 3/2020 | Tomimatsu | |
| 11,227,832 B2 | 1/2022 | Hosotani et al. | |
| 11,495,612 B2 | 11/2022 | Tanaka et al. | |
| 11,690,233 B2 | 6/2023 | Kim | |
| 2019/0088672 A1* | 3/2019 | Tomimatsu ........ | G11C 16/0483 |
| 2019/0326315 A1* | 10/2019 | Lee ........................ | H10B 43/10 |

(Continued)

FOREIGN PATENT DOCUMENTS

| | | |
|---|---|---|
| KR | 10-2015-0139255 | 12/2015 |
| KR | 10-2019-0057669 | 5/2019 |

(Continued)

*Primary Examiner* — Mohsen Ahmadi
(74) *Attorney, Agent, or Firm* — Fish & Richardson P.C.

(57) ABSTRACT

The present disclosure relates to three-dimensional (3D) semiconductor memory devices and electronic systems. An example 3D semiconductor memory device comprises a substrate that includes a cell array region and a connection region, a structure in which a plurality of dielectric layers and a plurality of gate electrodes are alternately stacked on the substrate, a plurality of dummy vertical structures that extend through the structure on the connection region, and a gate contact that extends through the structure on the connection region and is connected to one gate electrode of the plurality of gate electrodes. The gate contact is between the plurality of dummy vertical structures in a plan view. The gate contact includes a first portion and a plurality of second portions that extend between the plurality of dummy vertical structures.

18 Claims, 30 Drawing Sheets

(56) References Cited

U.S. PATENT DOCUMENTS

| | | | | |
|---|---|---|---|---|
| 2019/0341456 | A1* | 11/2019 | Choi | H10B 41/27 |
| 2019/0393238 | A1* | 12/2019 | Lim | H10B 43/27 |
| 2020/0091186 | A1* | 3/2020 | Yang | H10B 43/10 |
| 2020/0144380 | A1* | 5/2020 | Hwang | H10B 41/10 |
| 2020/0194373 | A1* | 6/2020 | Baek | H10B 43/10 |
| 2020/0194455 | A1* | 6/2020 | Cho | H10B 43/27 |
| 2020/0203370 | A1* | 6/2020 | Son | H10B 43/27 |
| 2022/0310652 | A1* | 9/2022 | Son | H10B 43/27 |
| 2022/0399359 | A1* | 12/2022 | Kim | H10B 43/10 |
| 2024/0074203 | A1* | 2/2024 | Jung | H10B 43/27 |
| 2024/0081062 | A1* | 3/2024 | Kim | H10B 41/50 |

FOREIGN PATENT DOCUMENTS

| | | |
|---|---|---|
| KR | 10-2021-0104607 | 8/2021 |
| KR | 10-2022-0068534 | 5/2022 |
| KR | 10-2421728 | 7/2022 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This application claims priority under 35 U.S.C § 119 to Korean Patent Application No. 10-2023-0110269 filed on Aug. 23, 2023 in the Korean Intellectual Property Office, the disclosure of which is hereby incorporated by reference in its entirety.

BACKGROUND

Semiconductor devices capable of storing a large amount of data are needed in an electronic system which requires data storage. Semiconductor devices have been integrated to meet high performance and low manufacturing costs required by customers. Integration of typical two-dimensional (2D) or planar semiconductor devices is primarily determined by the area occupied by a unit memory cell, such that it is influenced by the technology for forming fine patterns. However, expensive processing equipment needed to reduce pattern size may set a practical limitation on increasing the integration of the two-dimensional or planar semiconductor devices. Therefore, three-dimensional (3D) semiconductor memory devices having three-dimensionally arranged memory cells have been proposed.

SUMMARY

The present disclosure relates to semiconductor memory devices, including a three-dimensional semiconductor memory device with improved electrical properties and increased reliability, and electronic systems including the same.

The subject matter of the present disclosure is not limited to the mentioned above, and other features and advantages will be understood by those skilled in the art from the following description.

In general, according to some aspects, a three-dimensional semiconductor memory device comprises: a substrate that includes a cell array region and a connection region; a stack structure in which a plurality of dielectric layers and a plurality of gate electrodes are alternately stacked on the substrate; a plurality of dummy vertical structures that penetrate the stack structure on the connection region; and a gate contact that penetrates the stack structure on the connection region, the gate contact being connected to one of the gate electrodes. The gate contact may be between the dummy vertical structures when viewed in plan. The gate contact may include: a first portion; and a plurality of second portions that extend between the dummy vertical structures.

In general, according to some aspects, a three-dimensional semiconductor memory device comprises: a substrate that includes a cell array region and a connection region; a stack structure that includes a plurality of dielectric layers and a plurality of gate electrodes that are alternately stacked on the substrate; a plurality of vertical channel structures that penetrate the stack structure on the cell array region; a plurality of gate contacts that penetrate the stack structure on the connection region, the gate contacts being correspondingly connected to the gate electrodes; a plurality of dummy vertical structures that penetrate the stack structure on the connection region; a plurality of dielectric patterns in contact with sidewalls of the gate contacts; a plurality of bit lines on the stack structure and connected to the vertical channel structures; and a plurality of conductive lines on the stack structure and connected to the gate contacts. Each of the gate contacts may include: a first portion; and a plurality of second portions that protrude from the first portion. Some of the second portions may extend in a first direction. Others of the second portions may extend in a second direction that intersects the first direction.

In general, according to some aspects, an electronic system comprises: a three-dimensional semiconductor memory device including a substrate that includes a cell array region and a connection region, a stack structure that includes a plurality of gate electrodes stacked on the substrate, a plurality of dummy vertical structures that penetrate the stack structure on the connection region, a gate contact that is adjacent to the dummy vertical structures and penetrates a portion of the stack structure, and an input/output pad electrically connected to peripheral circuits; and a controller that has electrical connection through the input/output pad with the three-dimensional semiconductor memory device and controls the three-dimensional semiconductor memory device. The stack structure may extend in one direction while surrounding the dummy vertical structures and the gate contact. The gate contact may include: a first portion; and a plurality of second portions that protrude from the first portion and extend between the dummy vertical structures.

DETAILED DESCRIPTION

Figure 1:
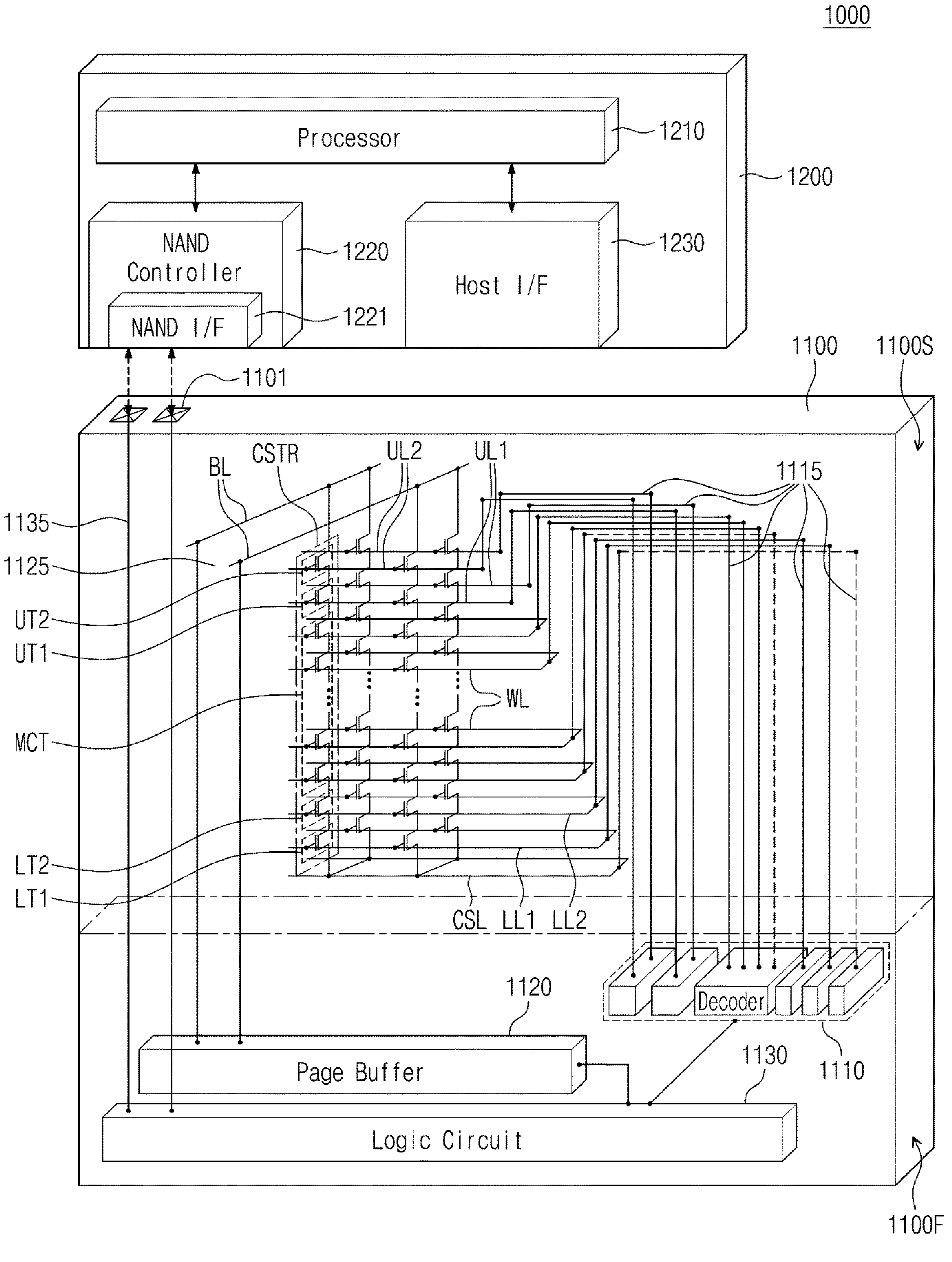
FIG. 1 illustrates a simplified diagram showing an example of an electronic system including a three-dimensional semiconductor memory device.

The following will now describe some implementations of the present disclosure with reference to the accompanying drawings. Like reference numerals may indicate like components throughout the description.

FIG. 1 illustrates a simplified diagram showing an example of an electronic system including a three-dimensional semiconductor memory device.

Referring to FIG. 1, an electronic system 1000 may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as a NAND Flash memory device. The semiconductor device 1100 may include a first structure 1100F and a second structure 1100S on the first structure 1100F. Alternatively, the first structure 1100F may be disposed on a side of the second structure 1100S.

The first structure 1100F may be a peripheral circuit structure that includes a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT between the lower transistors LT1 and LT2 and the upper transistors UT1 and UT2. The number of the lower transistors LT1 and LT2 and of the upper transistors UT1 and UT2 may be variously changed in some implementations.

The upper transistors UT1 and UT2 may include string selection transistors, and the lower transistors LT1 and LT2 may include ground selection transistors. The first and second gate lower lines LL1 and LL2 may be gate electrodes of the lower transistors LT1 and LT2, respectively. The word lines WL may be gate electrodes of the memory cell transistors MCT, and the first and second gate upper lines UL1 and UL2 may be gate electrodes of the upper transistors UT1 and UT2, respectively.

For example, the lower transistors LT1 and LT2 may include a lower erase control transistor and a ground selection transistor that are connected in series. The upper transistors UT1 and UT2 may include a string selection transistor and an upper erase control transistor that are connected in series. One or both of the lower and upper erase control transistors may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F to the second structure 1100S. The bit lines BL may be electrically connected to the page buffer 1120 through second connection lines 1125 that extend from the first structure 1100F to the second structure 1100S.

In the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F to the second structure 1100S.

Although not shown, the first structure 1100F may include a voltage generator. The voltage generator may produce program voltages, read voltages, pass voltages, and verification voltages that are required for operating the memory cell strings CSTR. The program voltage may be relatively higher (e.g., about 20 V to about 40 V) than the read voltage, the pass voltage, and the verification voltage.

For example, the first structure 1100F may include high-voltage transistors and low-voltage transistors. The decoder circuit 1110 may include pass transistors connected to the word lines WL of the memory cell strings CSTR. The pass transistors may include high-voltage transistors capable of withstanding high voltages such as program voltages applied to the word lines WL in a program operation. The page buffer 1120 may also include high-voltage transistors capable of withstanding high voltages.

The controller 1200 may include a processor 1210, a NAND controller 1220, and a host interface 1230. For example, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data intended to be written on the memory cell transistors MCT of the semiconductor device 1100, and/or data intended to be read from the memory cell transistors MCT of the semiconductor device 1100. The host interface 1230 may provide the electronic system 1000 with communication with an external host. When a control command is received through the host interface 1230 from the external host, the semiconductor device 1100 may be controlled by the processor 1210 in response to the control command.

Figure 2:
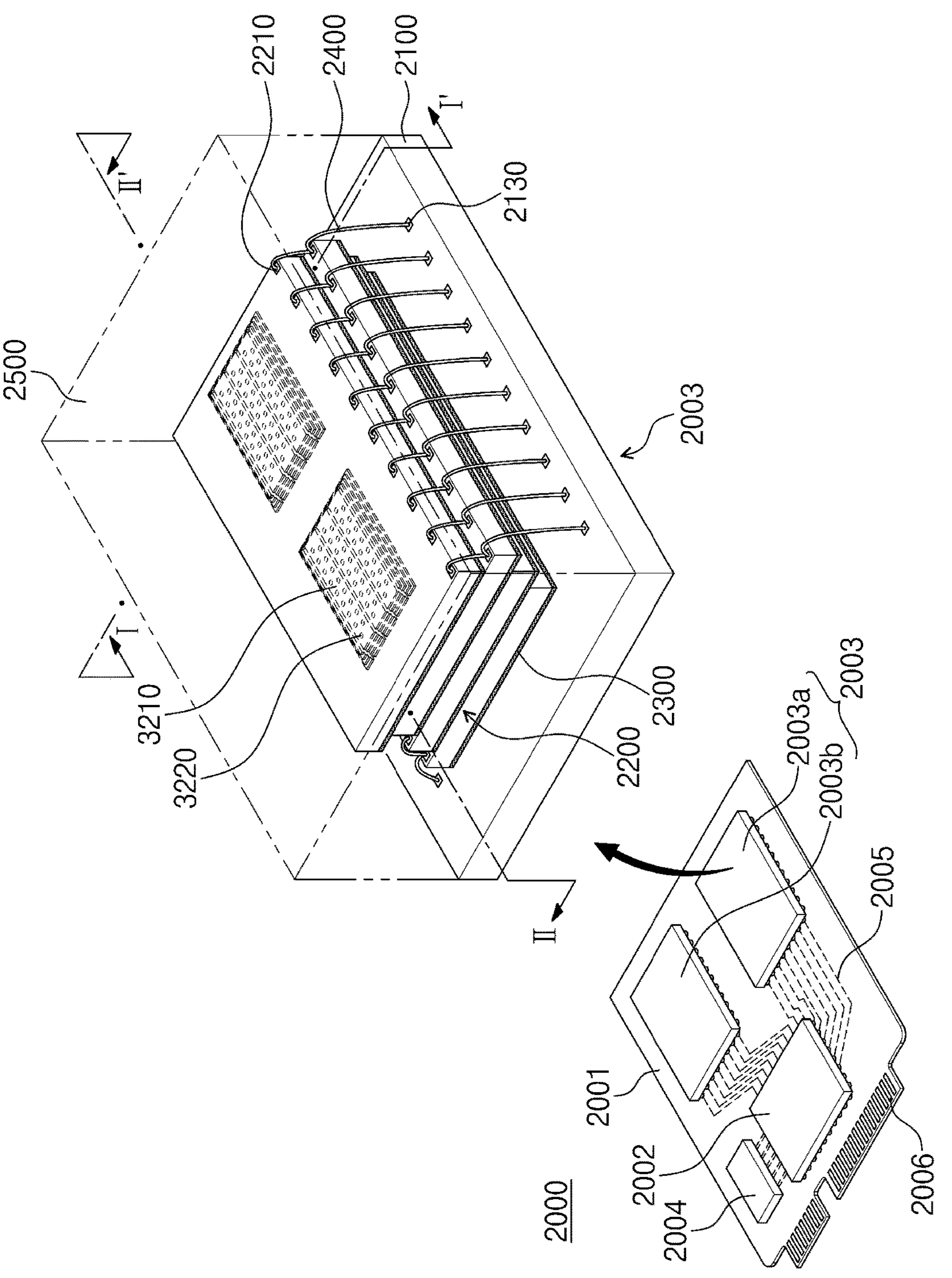
FIG. 2 illustrates a simplified perspective view showing an example of a semiconductor package including a three-dimensional semiconductor memory device.

FIG. 2 illustrates a simplified perspective view showing an example of a semiconductor package including a three-dimensional semiconductor memory device.

Referring to FIG. 2, an electronic system 2000 may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 formed on the main board 2001.

The main board 2001 may include a connector 2006 including a plurality of pins that are coupled to an external host. The number and arrangement of the plurality of pins on the connector 2006 may be changed based on a communication interface between the electronic system 2000 and an external host. The electronic system 2000 may communicate with the external host through one or more interfaces, for example, universal serial bus (USB), peripheral component interconnect express (PIC-Express), serial advanced technology attachment (SATA), and M-PHY for universal flash storage (UFS). In addition, the electronic system 2000 may operate with power supplied through the connector 2006 from an external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages 2003*a* and 2003*b* that are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesion layers 2300 disposed on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be a printed circuit board including upper pads 2130. Each of the semiconductor chips 2200 may include one or more input/output pads 2210. The input/output pad 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device.

For example, the connection structures 2400 may include bonding wires that electrically connect the input/output pads 2210 to the upper pads 2130. Therefore, in each of the first and second semiconductor packages 2003*a* and 2003*b*, the semiconductor chips 2200 may be electrically connected to each other in a bonding wire manner, and may be electrically connected to the upper pads 2130 of the package substrate 2100. Alternatively, in each of the first and second semiconductor packages 2003*a* and 2003*b*, the semiconductor chips 2200 may be electrically connected to each other through connection structures such as through silicon vias (TSV) instead of the connection structures 2400 shaped like bonding wires.

For example, the controller 2002 and the semiconductor chips 2200 may be included in a single package. In some implementations, the controller 2002 and the semiconductor chips 2200 may be mounted on a discrete interposer substrate other than the main board 2001, and may be electrically connected through wiring lines formed on the interposer substrate.

Figure 3:
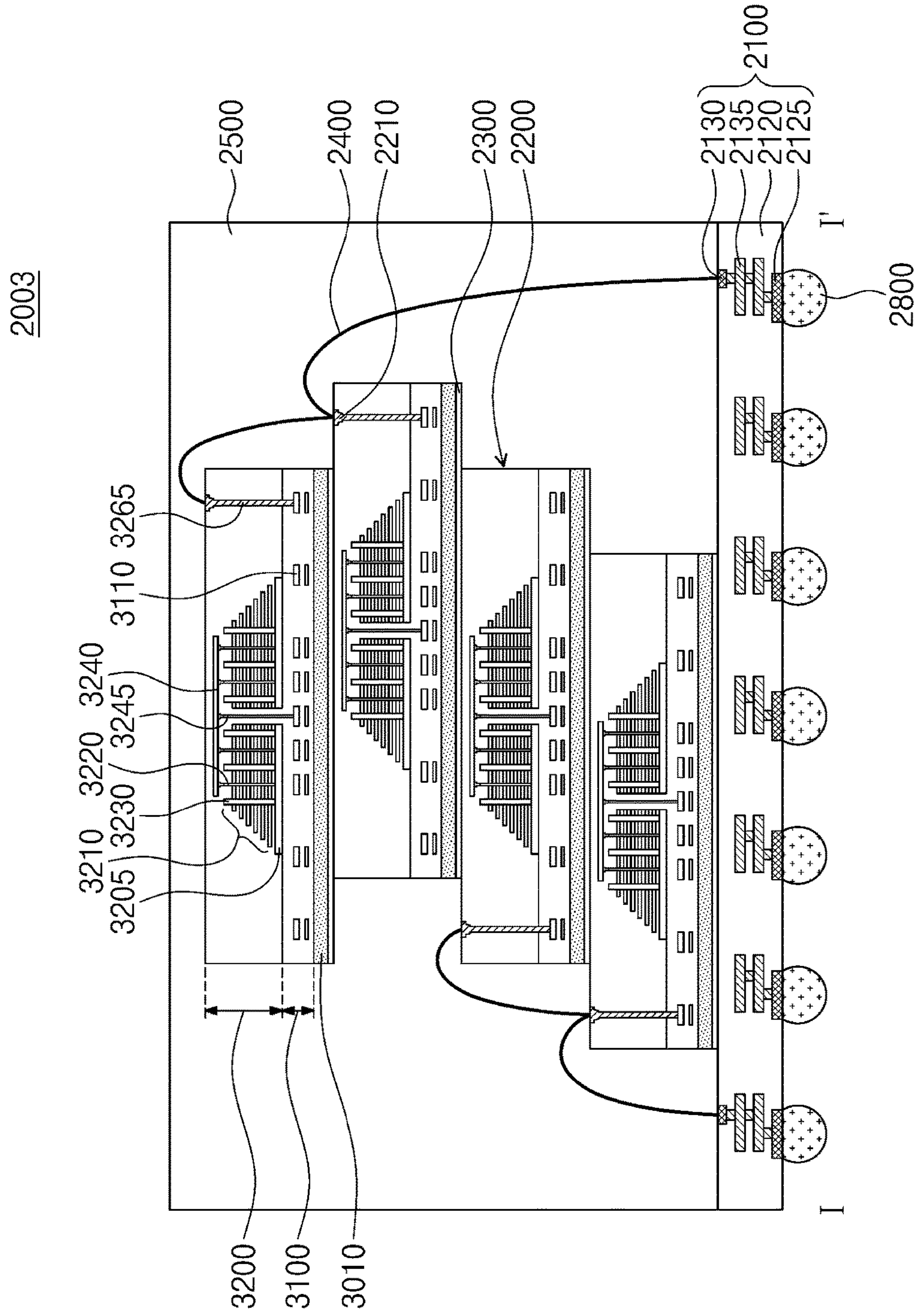
FIGS. 3 and 4 illustrate example cross-sectional views respectively taken along lines I-I' and II-II' of FIG. 2.
Figure 4:
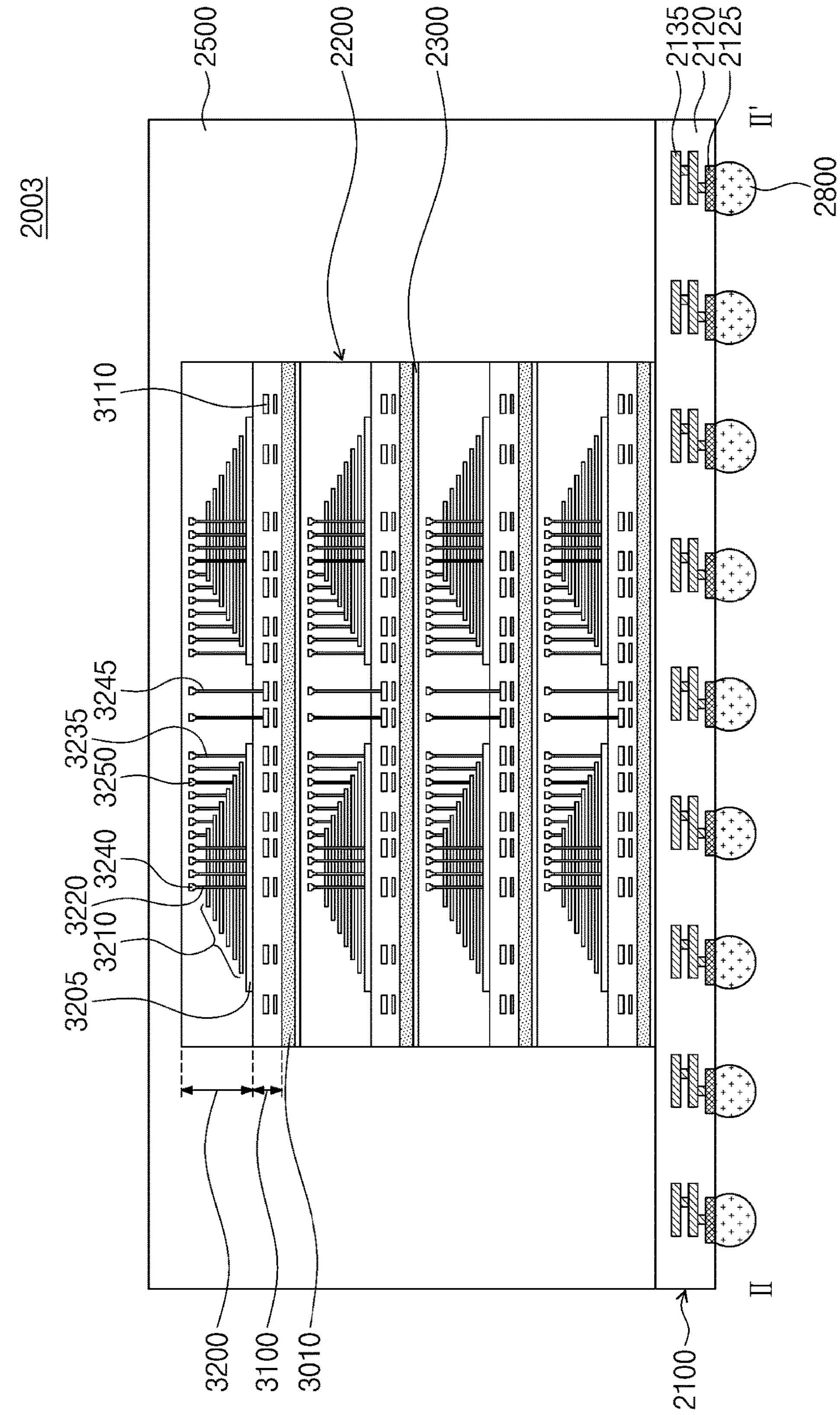

FIGS. 3 and 4 illustrate example cross-sectional views respectively taken along lines I-I' and II-II' of FIG. 2.

Referring to FIGS. 3 and 4, the semiconductor package 2003 may include a package substrate 2100, a plurality of semiconductor chips 2200 on the package substrate 2100, and a molding layer 2500 that covers the package substrate 2100 and the plurality of semiconductor chips 2200.

The package substrate 2100 may include a package substrate body 2120, upper pads 2130 disposed on a top surface of the package substrate body 2120, lower pads 2125 disposed or exposed on a bottom surface of the package substrate body 2120, and internal wiring lines 2135 that lie in the package substrate body 2120 and electrically connect the upper pads 2130 to the lower pads 2125. The upper pads 2130 may be electrically connected to a plurality of connection structures 2400. The lower pads 2125 may be connected through conductive connectors 2800 to the wiring patterns 2005 in the main board 2001 of the electronic system 2000 depicted in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a common source line 3205, a gate stack structure 3210 on the common source line 3205, vertical channel structures 3220 and separation structures 3230 that penetrate the gate stack structure 3210, bit lines 3240 electrically connected to the vertical channel structures 3220, and conductive lines 3250 and gate connection lines 3235 electrically connected to word lines (see WL of FIG. 1) of the gate stack structure 3210.

Each of the semiconductor chips 2200 may include one or more through wiring lines 3245 that extend into the second structure 3200 and are electrically connected to the peripheral wiring lines 3110 of the first structure 3100. The through wiring line 3245 may penetrate the gate stack structure 3210, and may further be disposed outside the gate stack structure 3210. Each of the semiconductor chips 2200 may further include an input/output connection line 3265 that extends into the second structure 3200 and is electrically connected to the peripheral wiring lines 3110 of the first structure 3100, and may also further include input/output pads 2210 electrically connected to the input/output connection line 3265.

Figure 5:
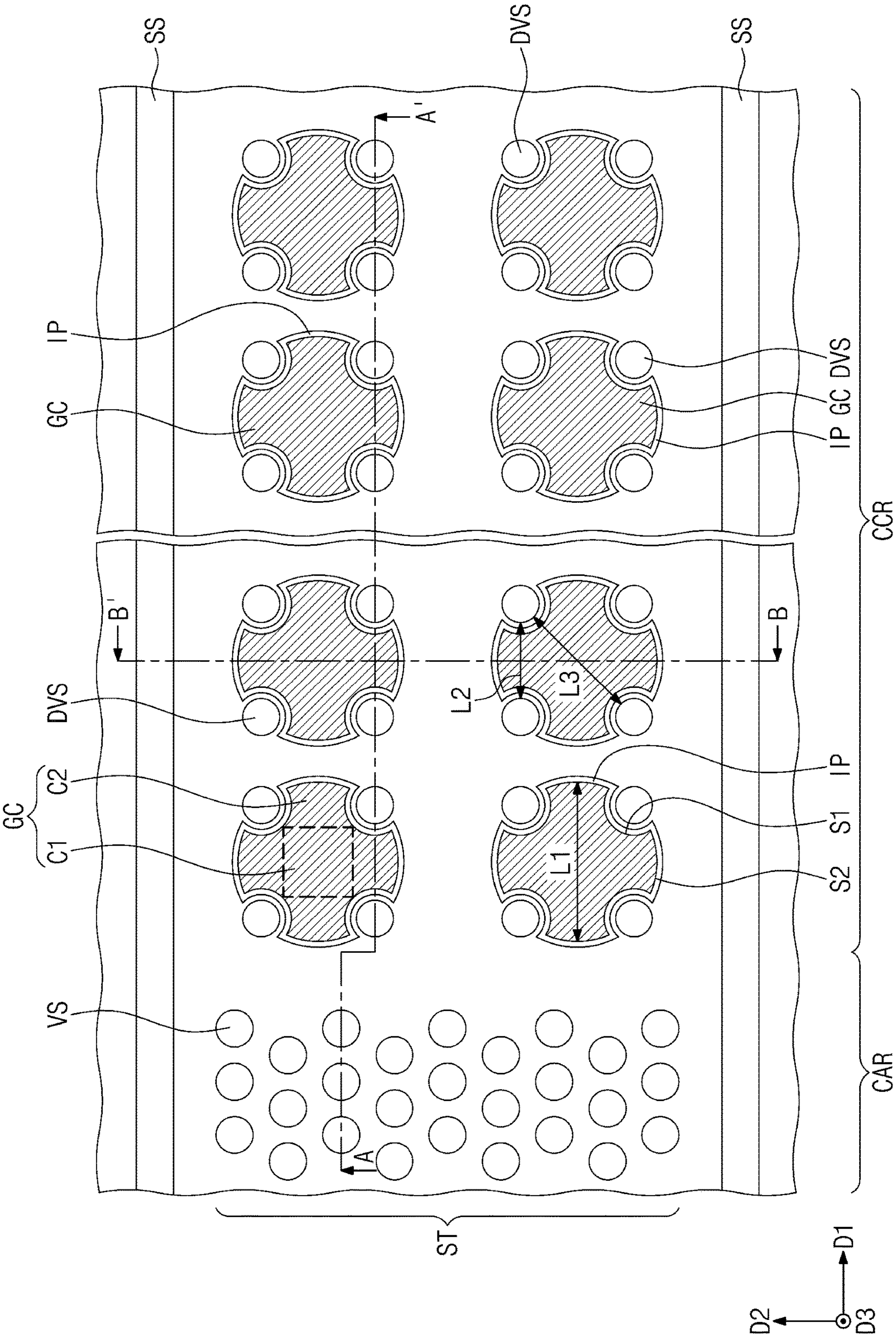
FIG. 5 illustrates a plan view showing an example of a three-dimensional semiconductor memory device.
Figure 6:
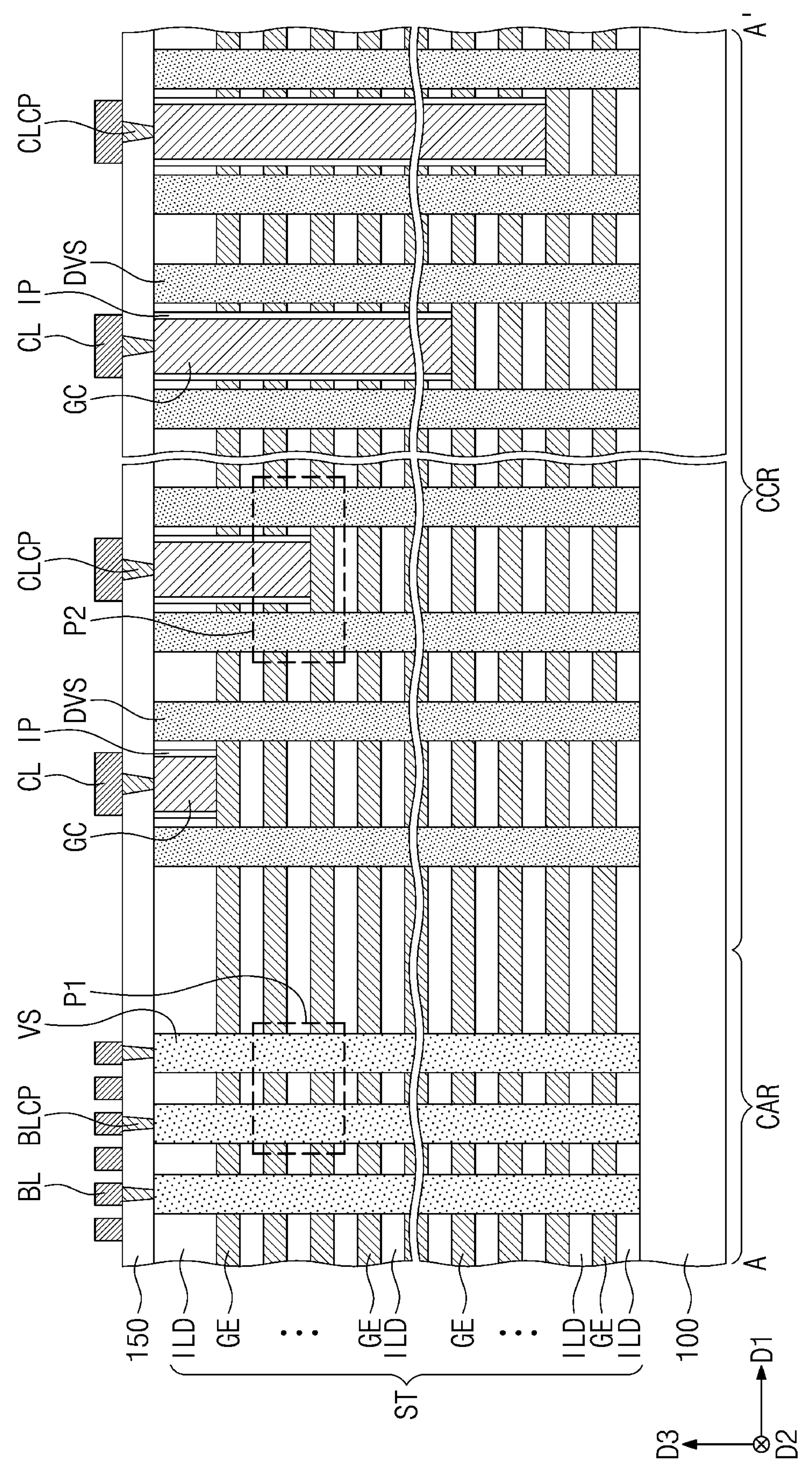
FIGS. 6 and 7 illustrate example cross-sectional views respectively taken along lines A-A' and B-B' of FIG. 5.
Figure 7:
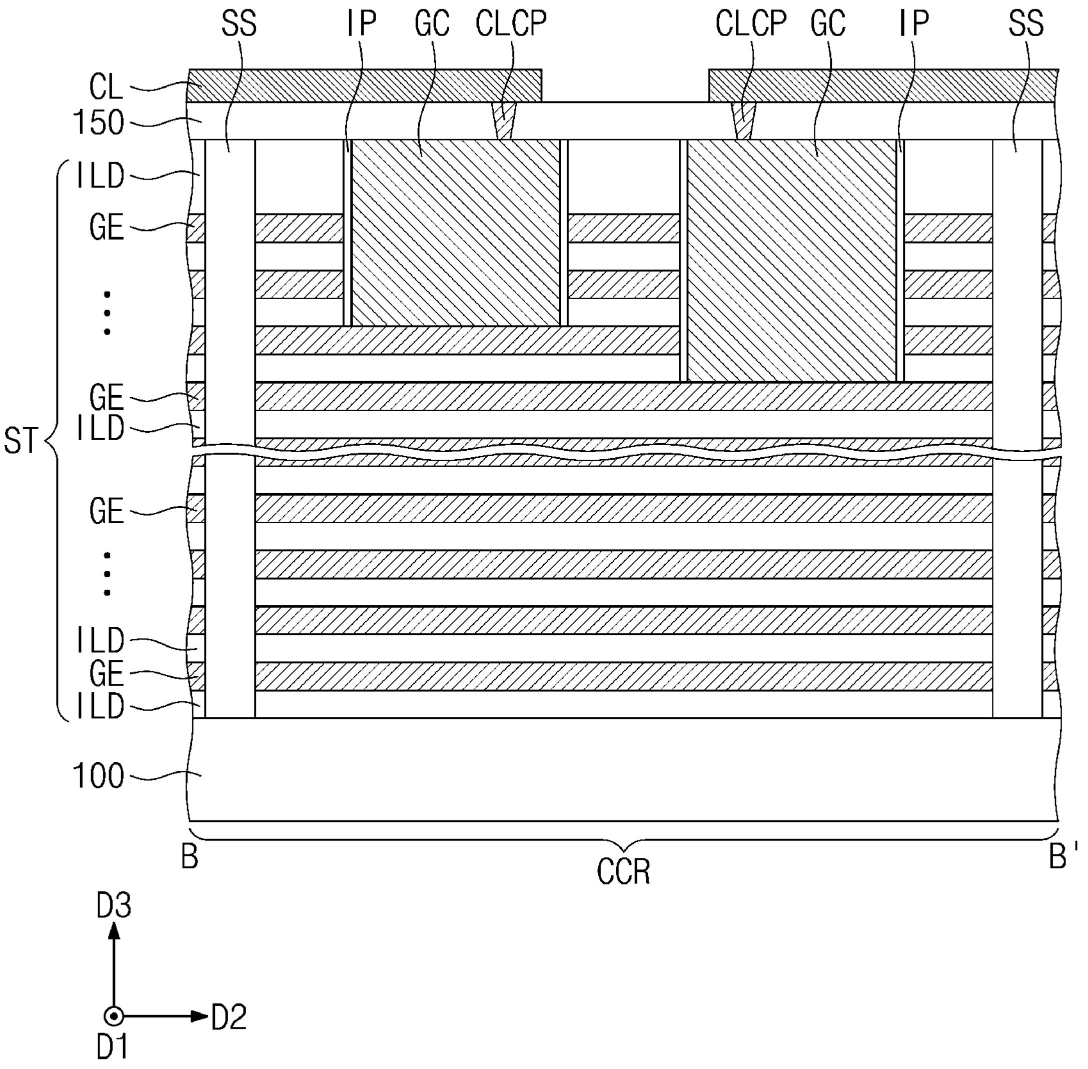
Figure 8A:
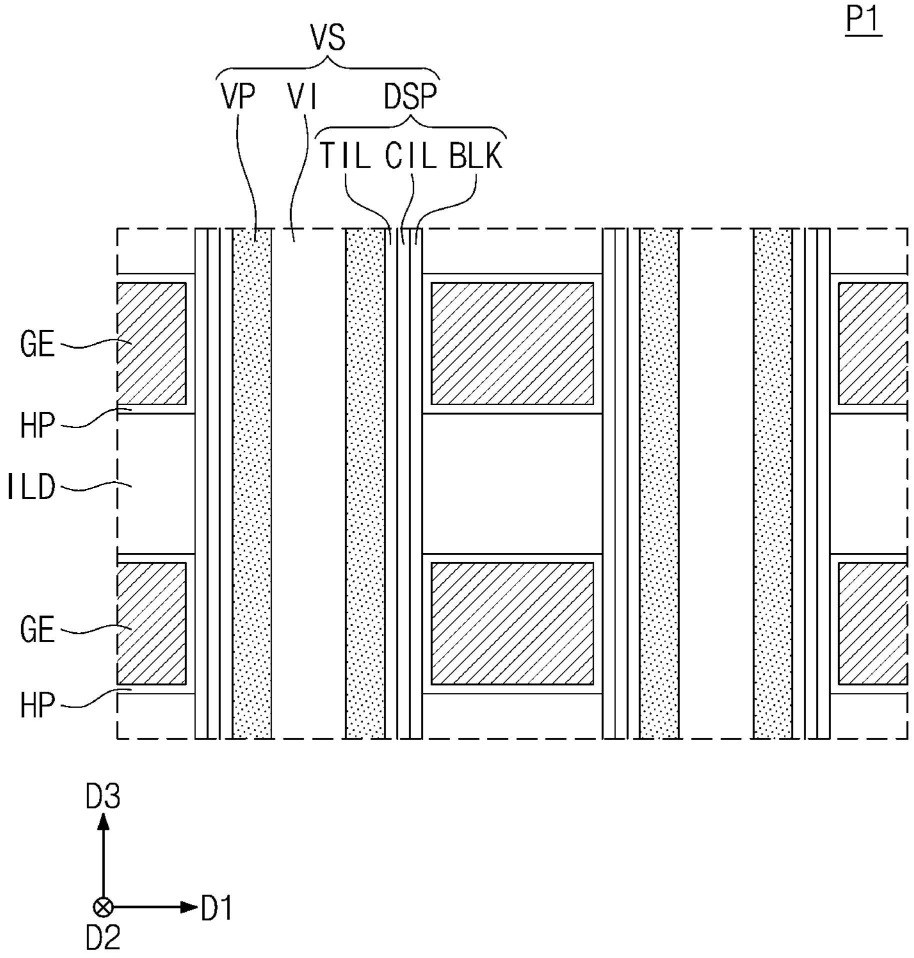
FIG. 8A illustrates an example enlarged view showing section P1 of FIG. 6.
Figure 8B:
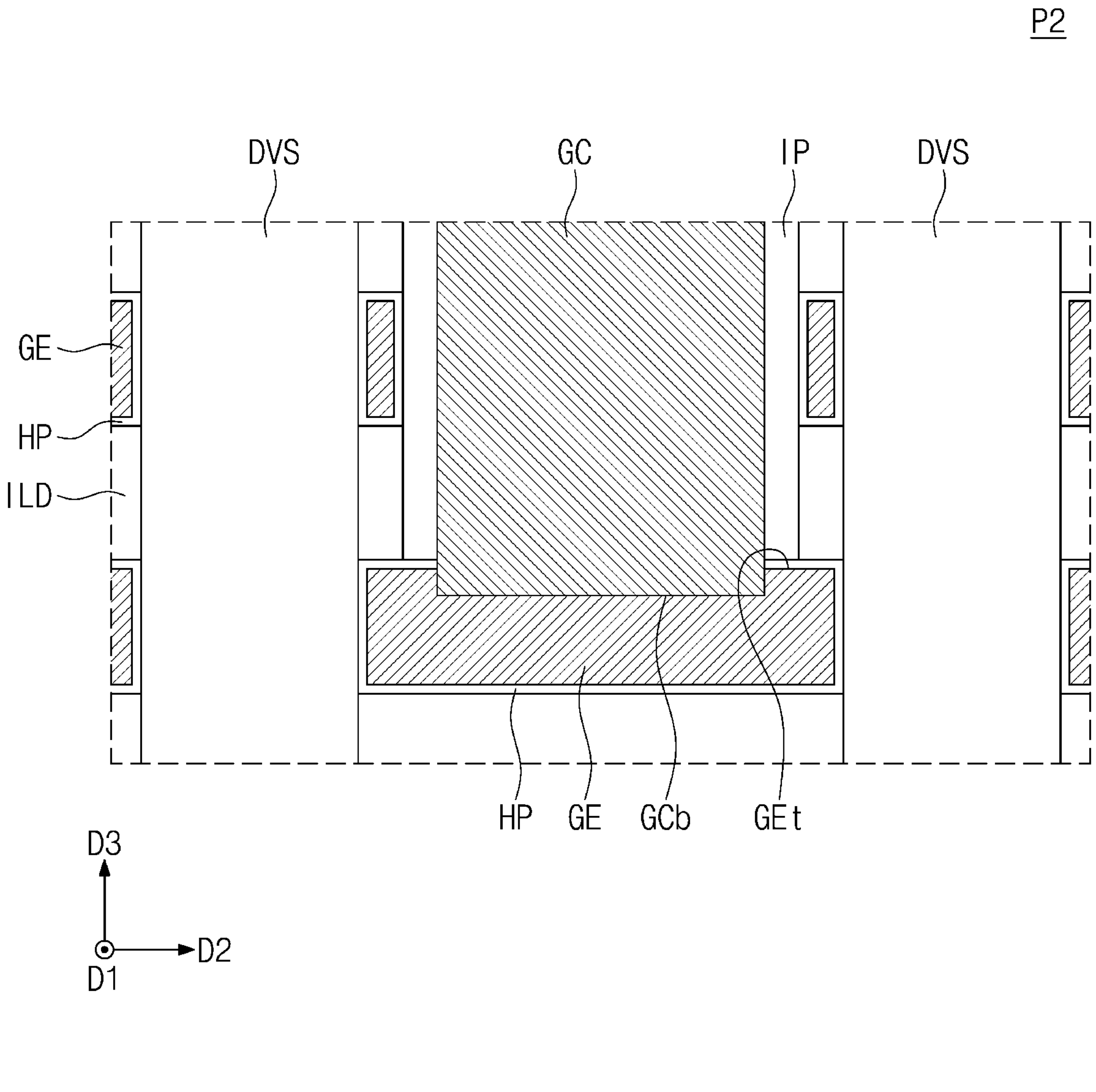
FIG. 8B illustrates an example enlarged view showing section P2 of FIG. 6.

FIG. 5 illustrates a plan view showing an example of a three-dimensional semiconductor memory device. FIGS. 6 and 7 illustrate example cross-sectional views respectively taken along lines A-A' and B-B' of FIG. 5. FIG. 8A illustrates an example enlarged view showing section P1 of FIG. 6. FIG. 8B illustrates an example enlarged view showing section P2 of FIG. 6.

Referring to FIGS. 5, 6, and 7, a three-dimensional semiconductor memory device may include a substrate 100, a stack structure ST, vertical channel structures VS, dummy vertical structures DVS, gate contacts GC, bit lines BL, and connection lines CL.

The substrate 100 may include a cell array region CAR and a connection region CCR. The substrate 100 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof. The substrate 100 may include one or more of a semiconductor doped with impurities and an intrinsic semiconductor with no doped impurities. The substrate 100 may have at least one selected from a monocrystalline structure, an amorphous structure, and a polycrystalline structure. Alternatively, the substrate 100 may be formed of a dielectric material such as silicon oxide.

The stack structure ST may be disposed on the substrate 100. The stack structure ST may extend along a first direction D1 from the cell array region CAR toward the connection region CCR. The stack structure ST may have a uniform thickness on the cell array region CAR and the connection region CCR.

The stack structure ST may include electrodes GE and dielectric layers ILD that are alternately stacked along a third direction D3 (or a vertical direction) perpendicular to first and second directions D1 and D2 that intersect each other. The gate electrodes GE may have substantially the same thickness. A thickness of an uppermost one of the dielectric layers ILD may be greater than those of other dielectric layers ILD, but the present disclosure is not limited thereto.

The gate electrodes GE may include, for example, at least one selected from doped semiconductors (e.g., doped silicon), metals (e.g., tungsten, copper, or aluminum), conductive metal nitrides (e.g., titanium nitride or tantalum nitride), and transition metals (e.g., titanium or tantalum). The dielectric layers ILD may include, for example, a silicon oxide layer or a low-k dielectric layer.

The gate electrodes GE and the dielectric layers ILD may each extend in the first direction D1 and have a length in the first direction D1. The gate electrodes GE and the dielectric layers ILD may have substantially the same horizontal length. For example, the stack structure ST may have no stepwise structure on the connection region CCR. Therefore, a length in the first direction D1 of the stack structure ST may decrease on the connection region CCR. Accordingly, the three-dimensional semiconductor memory device may become small in size.

In some implementations, a NAND Flash memory device may be adopted as the three-dimensional semiconductor memory device. In this case, the gate electrodes GE of the stack structure ST may be used as gate electrodes of the string selection transistor, the memory cell transistors, and ground selection transistors of FIG. 1.

A plurality of vertical channel structures VS may penetrate the stack structure ST on the cell array region CAR. When viewed in plan, the vertical channel structures VS may be arranged in one direction or in a zigzag fashion.

Each of the vertical channel structures VS may have an upper width at a top surface of the uppermost one of the dielectric layers ILD. Each of the vertical channel structures VS may have a lower width at a bottom surface thereof. The lower width may be less than the upper width, but the present disclosure is not limited thereto. For example, the upper width and the lower widths of each of the vertical channel structures VS may be substantially the same as each other. A distance between neighboring vertical channel structures VS may be less than the upper width of each of the vertical channel structures VS.

Referring to FIG. 8A, each of the vertical channel structures VS may include a vertical semiconductor pattern VP, a data storage pattern DSP that a sidewall of the vertical semiconductor pattern VP, and a gap-fill dielectric pattern VI in the vertical semiconductor pattern VP.

The vertical semiconductor pattern VP may have a macaroni shape or a pipe shape whose bottom end is closed. The vertical semiconductor pattern VP may be shaped like U and may be filled with the gap-fill dielectric pattern VI. A bit-line conductive pad may be formed on a top end of the vertical semiconductor pattern VP, and may be formed of an impurity-undoped semiconductor material, an impurity-doped semiconductor material, or a conductive material.

The vertical semiconductor pattern VP may include a semiconductor material, such as silicon (Si), germanium (Ge), or a mixture thereof. The vertical semiconductor pattern VP including a semiconductor material may be used as channels of memory cell transistors that constitute a cell string.

The data storage pattern DSP may extend in the third direction D3 and may surround the sidewall of the vertical semiconductor pattern VP. The data storage pattern DSP may have a macaroni shape or a pipe shape whose top and bottom ends are opened. The data storage pattern DSP may be formed of a single thin layer or a plurality of thin layers. The data storage pattern DSP may include a tunnel dielectric layer TIL, a charge storage layer CIL, and a blocking dielectric layer BLK, which layers TIL, CIL, and BLK form a data storage layer of a vertical NAND Flash memory device. For example, the charge storage layer CIL may be a trap dielectric layer, a floating gate electrode, or a dielectric layer including conductive nano-dots. For example, the charge storage layer CIL may include at least one selected from a silicon nitride layer, a silicon oxynitride layer, a silicon-rich nitride layer, a nano-crystalline silicon layer, and a laminated trap layer. The tunnel dielectric layer TIL may be one of materials whose band gap is greater than that of the charge storage layer CIL, and the blocking dielectric layer BLK may be a high-k dielectric layer such as an aluminum oxide layer or a hafnium oxide layer.

A horizontal dielectric pattern HP may be provided between the data storage pattern DSP and sidewalls of the gate electrodes GE. The horizontal dielectric pattern HP may extend onto top and bottom surfaces of the gate electrode GE from the sidewalls of the gate electrodes GE. For example, the horizontal dielectric pattern HP may include one or more of a silicon oxide layer and a high-k dielectric layer.

Referring back to FIGS. 5, 6, and 7, a plurality of dummy vertical structures DVS may be provided on the connection region CCR and may penetrate the stack structure ST. The dummy vertical structures DVS may be positioned adjacent to the gate contacts GC. The dummy vertical structures DVS and the vertical channel structures VS may be formed simultaneously and may have substantially the same structure, but the present disclosure is not limited thereto. The dummy vertical structures DVS may serve to support the dielectric layers ILD of the stack structure ST in a subsequently described method of fabricating a three-dimensional semiconductor memory device.

Each of the dummy vertical structures DVS may have an upper width at the top surface of the uppermost one of the dielectric layers ILD. Each of the dummy vertical structures DVS may have a lower width at a bottom surface thereof. The lower width of the dummy vertical structures DVS may be less than the upper width of the dummy vertical structure DVS, but the present disclosure is not limited thereto. For example, the upper and lower widths of each of the dummy vertical structures DVS may be substantially the same as each other.

The gate contacts GC may be provided on the connection region CCR. Each of the gate contacts GC may penetrate a portion of the stack structure ST to come into connection with one of the gate electrodes GE of the stack structure ST. For example, the gate contacts GC may include at least one selected from metals (e.g., tungsten, copper, or aluminum), conductive metal nitrides (e.g., titanium nitride or tantalum nitride), and transition metals (e.g., titanium or tantalum).

The gate contacts GC may be disposed spaced apart from each other in the first and second directions D1 and D2 on the connection region CCR. As the gate electrodes GE are stacked along the third direction D3, the gate contacts GC connected to different gate electrodes GE may have different lengths in the third direction D3. For example, the gate contacts GC may have different vertical lengths from each other. The lengths in the third direction D3 of the gate contacts GC may decrease with decreasing distance from the cell array region CAR. For example, one of the gate contacts GC that is closest to the cell array region CAR may be connected to an uppermost one of the gate electrodes GE. One of the gate contacts GC that is farthest from the cell array region CAR may be connected to a lowermost one of the gate electrodes GE. For example, the gate contacts GC may have bottom surfaces located at different levels and top surfaces at the same level. The top surfaces of the gate contacts GC may be substantially coplanar with that of the uppermost one of the dielectric layers ILD.

When viewed in plan, the gate contacts GC may be surrounded by the stack structure ST. Each of the gate contacts GC may have an upper width at the top surface thereof and a lower width at the bottom surface thereof. The width of each of the gate contacts GC may be greater than or substantially the same as the upper width of each of the gate contacts GC. The gate contacts GC may have a width greater than that of the vertical channel structures VS and that of the dummy vertical structures DVS.

The gate contacts GC may have a first length L1 in the first direction D1. The first length L1 may be a maximum horizontal length of the gate contacts GC. A distance between neighboring dummy vertical structures DVS may be a second length L2 or a third length L3. The second length L2 may be a minimum distance between neighboring dummy vertical structures DVS. The third length L3 may be a maximum distance between neighboring dummy vertical structures DVS. The first length L1 may be greater than the second length L2 and the third length L3. For example, the first length L1 may be about 1 μm.

Each of the gate contacts GC may be positioned adjacent to a plurality of dummy vertical structures DVS. For example, one of the gate contacts GC may be positioned between four dummy vertical structures DVS. The present disclosure, however, is not limited thereto, and there may be a large change in the number of dummy vertical structures DVS adjacent to each of the gate contacts GC.

Each of the gate contacts GC may include a first portion C1 and second portions C2. The first portion C1 may be positioned between the dummy vertical structures DVS. When viewed in plan, the first portion C1 may be positioned between neighboring dummy vertical structures DVS. The second portions C2 may protrude from the first portion C1 and extend in different directions. For example, some of the second portions C2 may extend in the first direction D1. Others of the second portions C2 may extend in the second direction D2. When viewed in plan, each of the second portions C2 may extend between neighboring dummy vertical structures DVS and may be positioned between the dummy vertical structures DVS. None of the first portion C1 and the second portions C2 may be in contact with the dummy vertical structures DVS. When viewed in plan, the gate contacts GC may not overlap, but be spaced apart from, the dummy vertical structures DVS.

Each of the gate contacts GC may have a lateral surface, and the lateral surface of each of the gate contacts GC may include first surfaces S1 and second surfaces S2. The first surfaces S1 may be directed toward neighboring dummy vertical structures DVS. Each of the second surfaces S2 may be positioned between the first surfaces S1. One of the second surfaces S2 may be positioned between the first surfaces S1, and one of the first surfaces S1 may be positioned between the second surfaces S2. For example, each of the first surfaces S1 may have a concave shape toward the dummy vertical structure DVS. Each of the second surfaces S2 may have a convex shape between the dummy vertical structures DVS.

The gate contacts GC of the three-dimensional semiconductor memory device may each include the first portion C1 and the second portions C2 that extend between neighboring dummy vertical structures DVS. For example, each of the gate contacts GC may not have a circular shape when viewed in plan. A planar area of the gate contact GC may increase without overlapping the dummy vertical structures DVS, and thus an etching process may be easily performed to form the gate contacts GC. Therefore, the gate contacts GC may be prevented from process failure such as not-open issue, and the three-dimensional semiconductor memory device may improve in electrical properties.

Dielectric patterns IP may be provided between the gate contacts GC and the stack structure ST. When viewed in plan, the dielectric patterns IP may surround each of the gate contacts GC. The dielectric patterns IP may be in direct contact with sidewalls of the gate contacts GC. For example, the dielectric patterns IP may include at least one selected from silicon oxide, silicon nitride, silicon oxynitride, and low-k dielectrics.

The dielectric patterns IP may have different vertical lengths. The vertical lengths of the dielectric patterns IP may decrease with decreasing distance from the cell array region CAR. For example, the dielectric patterns IP may have bottom surface located at different levels and top surfaces located at the same level. The top surfaces of the dielectric patterns IP may be located at substantially the same level as that of the top surfaces of the gate contacts GC.

Referring to FIG. 8B, the dummy vertical structures DVS may be positioned on opposite sides of the gate contact GC. The dummy vertical structure DVS may be formed of one material, but the present disclosure is not limited thereto. Likewise the vertical channel structure VS, the dummy vertical structure DVS may be formed of layers including different materials. For example, the dummy vertical structure DVS may include at least one selected from silicon oxide, silicon nitride, silicon oxynitride, and low-k dielectrics.

The dielectric pattern IP may be provided on the lateral surface of the gate contact GC. The dielectric pattern IP may be positioned between the gate contact GC and an upper one of the gate electrodes GE. Thus, the gate contact GC may be electrically insulated from an upper one of the gate electrodes GE. The dielectric pattern IP may be positioned on and in contact with the horizontal dielectric pattern HP that surrounds the gate electrodes GE.

The dielectric pattern IP and the horizontal dielectric pattern HP may not be provided between the gate contact GC and the lower one of the gate electrodes GE. The gate contact GC may be in direct contact with the lower one of the gate electrodes GE. Thus, the gate contact GC may be electrically connected to the lower one of the gate electrodes GE. The dielectric pattern IP that surrounds the lateral surface of the gate contact GC may cause the gate contact GC to be electrically connected to one of the gate electrodes GE and to be electrically insulated from remaining ones of the gate electrodes GE.

A bottom surface GCb of the gate contact GC may be located at a level lower than that of a top surface GEt of the lower one of the gate electrodes GE. A portion of the gate contact GC may be provided within the lower one of the gate electrodes GE. The present disclosure, however, is not limited thereto, and the bottom surface GCb of the gate contact GC may be coplanar with the top surface GEt of the lower one of the gate electrodes GE.

Referring back to FIGS. 6 and 7, each of separation structures SS may extend along the first direction D1 from the cell array region CAR to the connection region CCR. The separation structures SS may be spaced apart from each other in the second direction D2 that intersects the first direction D1. The separation structures SS may further include a dielectric layer that covers opposite sidewalls of the stack structure ST. Each of the separation structures SS may have a single-layered or multi-layered structure. The separation structures SS may have top surfaces located at the same level as that of top surfaces of the vertical channel structures VS and that of the dummy vertical structures DVS. Each of the separation structures SS may have an upper width at its top surface and a lower width at its bottom surface. The upper and lower widths of each of the separation structures SS may be substantially the same as each other, but the present disclosure is not limited thereto.

A first interlayer dielectric layer 150 may be provided on the stack structure ST. The first interlayer dielectric layer 150 may cover the uppermost one of the dielectric layers ILD, the vertical channel structures VS, the dummy vertical structures DVS, and the gate contacts GC.

On the cell array region CAR, the bit lines BL may be provided on the first interlayer dielectric layer 150. The bit lines BL may extend in the second direction D2. The bit lines BL may be spaced apart from each other in the first direction D1. The bit lines BL may be electrically connected through bit-line contact plugs BLCP to the vertical channel structures VS.

On the connection region CCR, the connection lines CL may be provided on the first interlayer dielectric layer 150. The connection lines CL may extend in the second direction D2. The connection lines CL may be spaced apart from each other in the first direction D1 or the second direction D2. The connection lines CL may be electrically connected through connection-line contact plugs CLCP to the gate contacts GC.

The following will describe a three-dimensional semiconductor memory device according to some implementations of the present disclosure, and a detailed description of technical features duplicate to the implementations discussed above will be omitted and a difference thereof will be described.

Figure 9:
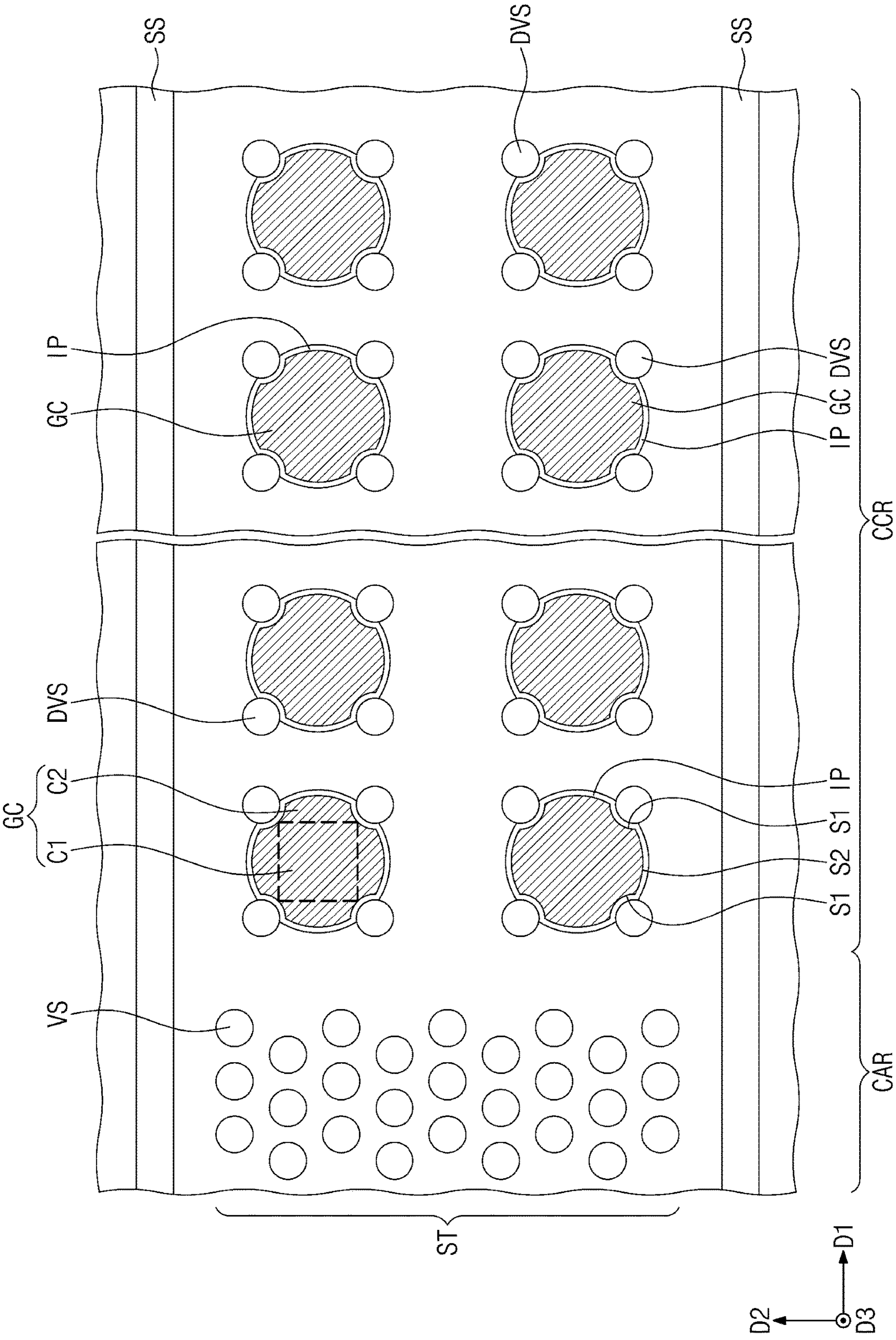
FIGS. 9 to 11 illustrate plan views showing an example of a three-dimensional semiconductor memory device.
Figure 10:
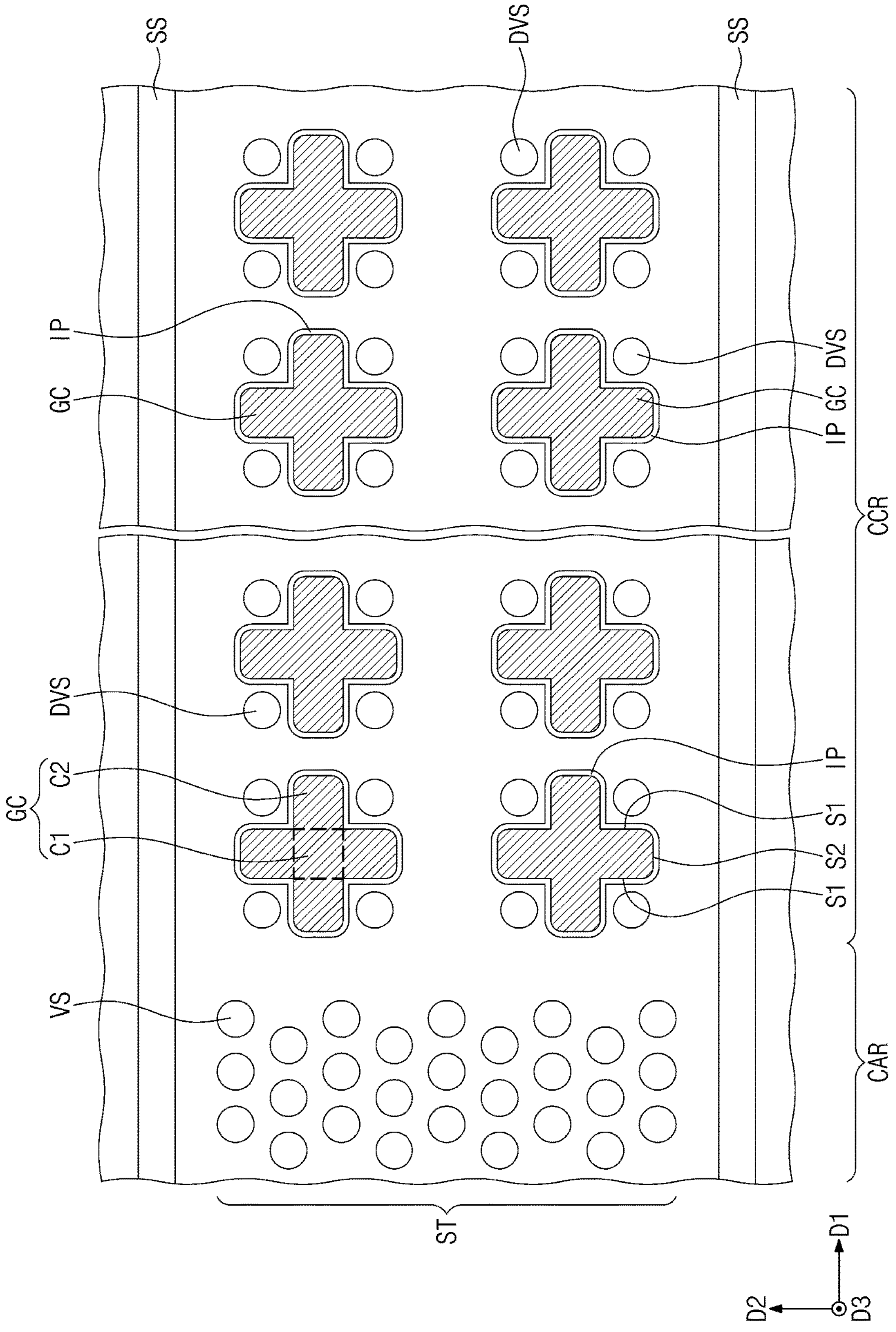
Figure 11:
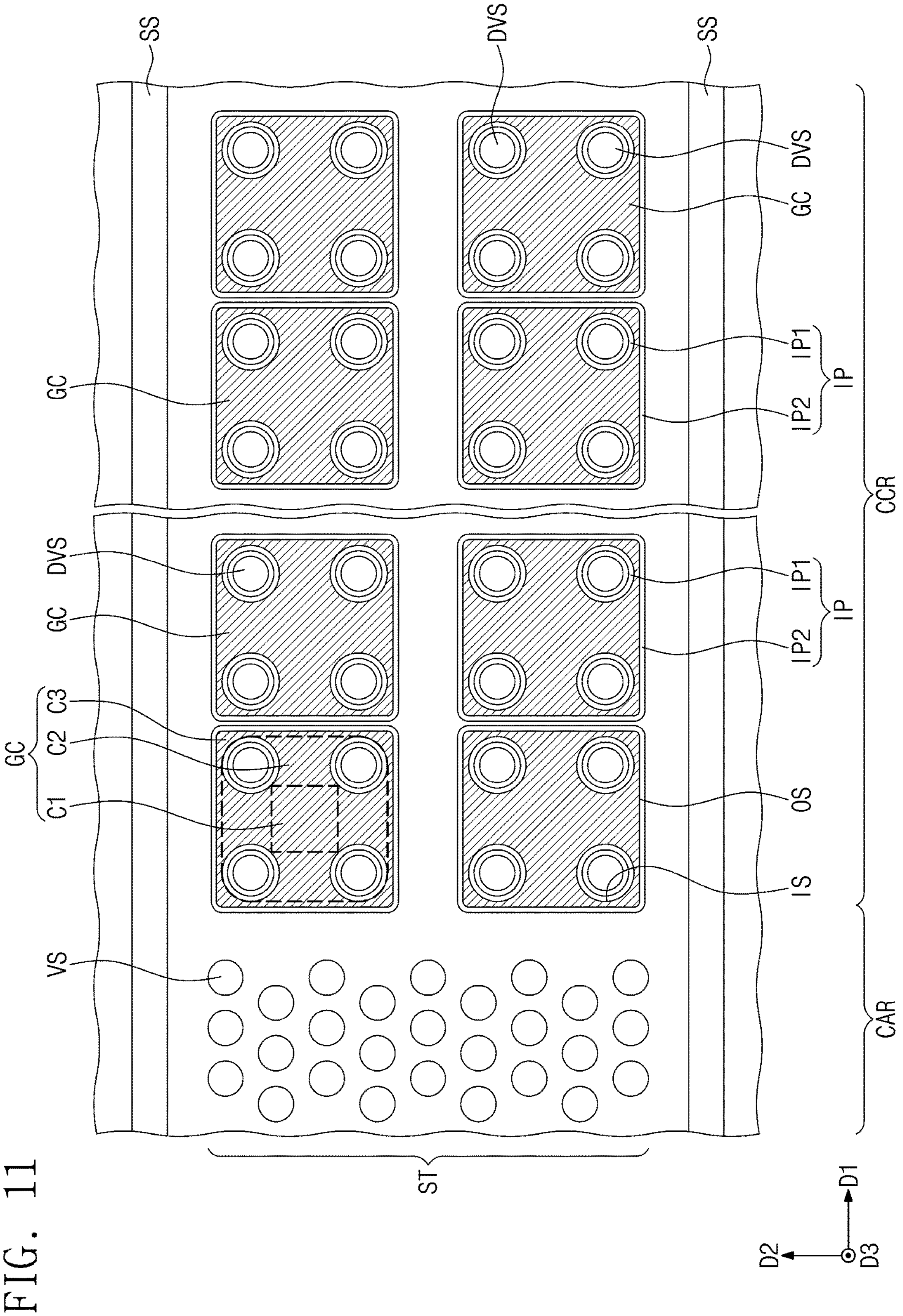

FIGS. 9 to 11 illustrate plan views showing an example of a three-dimensional semiconductor memory device.

Referring to FIG. 9, the gate contacts GC may be provided on the connection region CCR, and each of the gate contacts GC may include a first portion C1 and second portions C2 that protrude from the first portion C1. When viewed in plan, the first portion C1 may be positioned between neighboring dummy vertical structures DVS. Each of the second portions C2 horizontally protrudes from the first portion C1, and may be positioned between neighboring dummy vertical structures DVS. When viewed in plan, the first portion C1 may be positioned between the second portions C2.

The sidewall of each of the gate contacts GC may include first surfaces S1 and second surfaces S2, and the first surfaces S1 and the second surfaces S2 may be alternately positioned. The first surface S1 may have a concave shape while being directed toward the dummy vertical structure DVS. The second surface S2 may be positioned between neighboring dummy vertical structures DVS, and may have a convex shape between neighboring dummy vertical structures DVS. For example, the gate contact GC may have a similar shape as that depicted in FIG. 5, and may have a planar area less than that of the gate contact GC.

The dielectric patterns IP may be positioned between the gate contacts GC and neighboring dummy vertical structures DVS. The dielectric patterns IP may be positioned on and cover lateral surfaces of the gate contacts GC. The dielectric patterns IP may be in contact with neighboring dummy vertical structures DVS. As the dielectric patterns IP include a dielectric material such as one or more of silicon oxide, silicon nitride, silicon oxynitride, and low-k dielectrics, even when the dielectric patterns IP are in contact with the dummy vertical structures DVS, the gate contacts GC may be electrically insulated from the dummy vertical structures DVS.

Referring to FIG. 10, the gate contacts GC may be provided on the connection region CCR, and each of the gate contacts GC may include a first portion C1 and second portions C2. The second portions C2 may extend in the first and second directions D1 and D2 from the first portion C1. For example, some of the second portions C2 may extend in the first direction D1, and others of the second portions C2 may extend in the second direction D2. The second portions C2 may be positioned between neighboring dummy vertical structures DVS.

Each of the gate contacts GC may have a lateral surface, which lateral surface may include first surfaces S1 and second lateral surfaces S2. For example, the first surfaces S1 may be adjacent to the dummy vertical structures DVS and positioned between neighboring dummy vertical structures DVS. The first surfaces S1 may be parallel in the first direction D1 or the second direction D2. Some of the first surfaces S1 may be connected to each other, and the connected first surfaces S1 may intersect each other. Each of the second surfaces S2 may be positioned between the first surfaces S1. The second surfaces S2 may be parallel in the first direction D1 or the second direction D2. The second surfaces S2 may interest the first surfaces S1 connected thereto. When viewed in plan, each of the gate contacts GC may be spaced apart from neighboring dummy vertical structures DVS, and may have a cross shape.

Referring to FIG. 11, the gate contacts GC may be provided on the connection region CCR, and each of the gate contacts GC may include a first portion C1, second portions C2, and a third portion C3. Each of the second portions C2 may extend from the first portion C1 to a gap between neighboring dummy vertical structures DVS. When viewed in plan, the third portion C3 may surround the first portion C1, the second portions C2, and neighboring dummy vertical structures DVS. For example, the dummy vertical structures DVS may be positioned within the gate contacts GC.

Each of the gate contacts GC may have a lateral surface, which lateral surface may include an inner lateral surface IS and an outer lateral surface OS. The inner lateral surface IS may be formed of surfaces of the third portion C3 and the second portions C2. The outer lateral surface OS may be formed of a surface of the third portion C3. When viewed in plan, the inner lateral surface IS may be a lateral surface of the gate contact GC between the gate contact GC and the dummy vertical structures DVS. The outer lateral surface OS may be a lateral surface of the gate contact GC between the gate contact GC and the stack structure ST.

The dielectric patterns IP may be positioned on the lateral surfaces of the gate contacts GC, and may include a first dielectric pattern IP1 and a second dielectric pattern IP2. The first dielectric pattern IP1 may be positioned on and in contact with the inner lateral surface IS. The first dielectric pattern IP1 may be positioned between the gate contacts GC and the dummy vertical structures DVS and horizontally spaced apart from the dummy vertical structures DVS. The second dielectric pattern IP2 may be positioned on and in contact with the outer lateral surface OS. The second dielectric pattern IP2 may be positioned between the gate contacts GC and the stack structure ST, and may be in contact with the stack structure ST.

Referring back to FIGS. 9 to 11, the gate contact GC may include a first portion C1 and second portions C2 that extend from the first portion C1. When viewed in plan, the dummy vertical structures DVS may be completely surrounded by the gate contact GC. Thus, the gate contact GC may have an increased planar area while being spaced apart from neighboring dummy vertical structures DVS, and thus an etching process may be easily performed to form the gate contacts GC. Therefore, the gate contacts GC may be prevented from process failure such as not-open issue, and the three-dimensional semiconductor memory device may improve in electrical properties.

Figure 12:
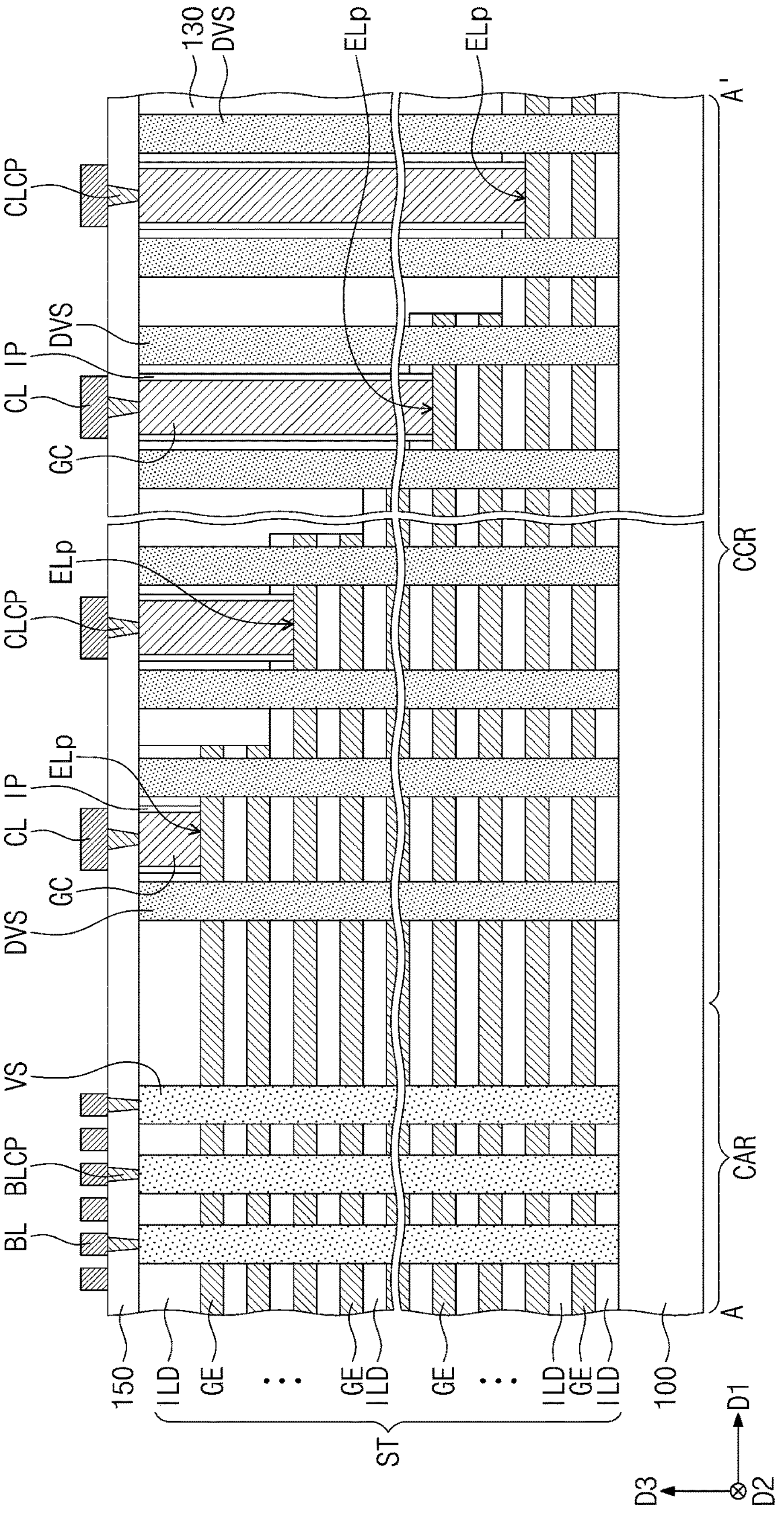
FIGS. 12 to 14 illustrate example cross-sectional views taken along line A-A' of FIG. 5.
Figure 13:
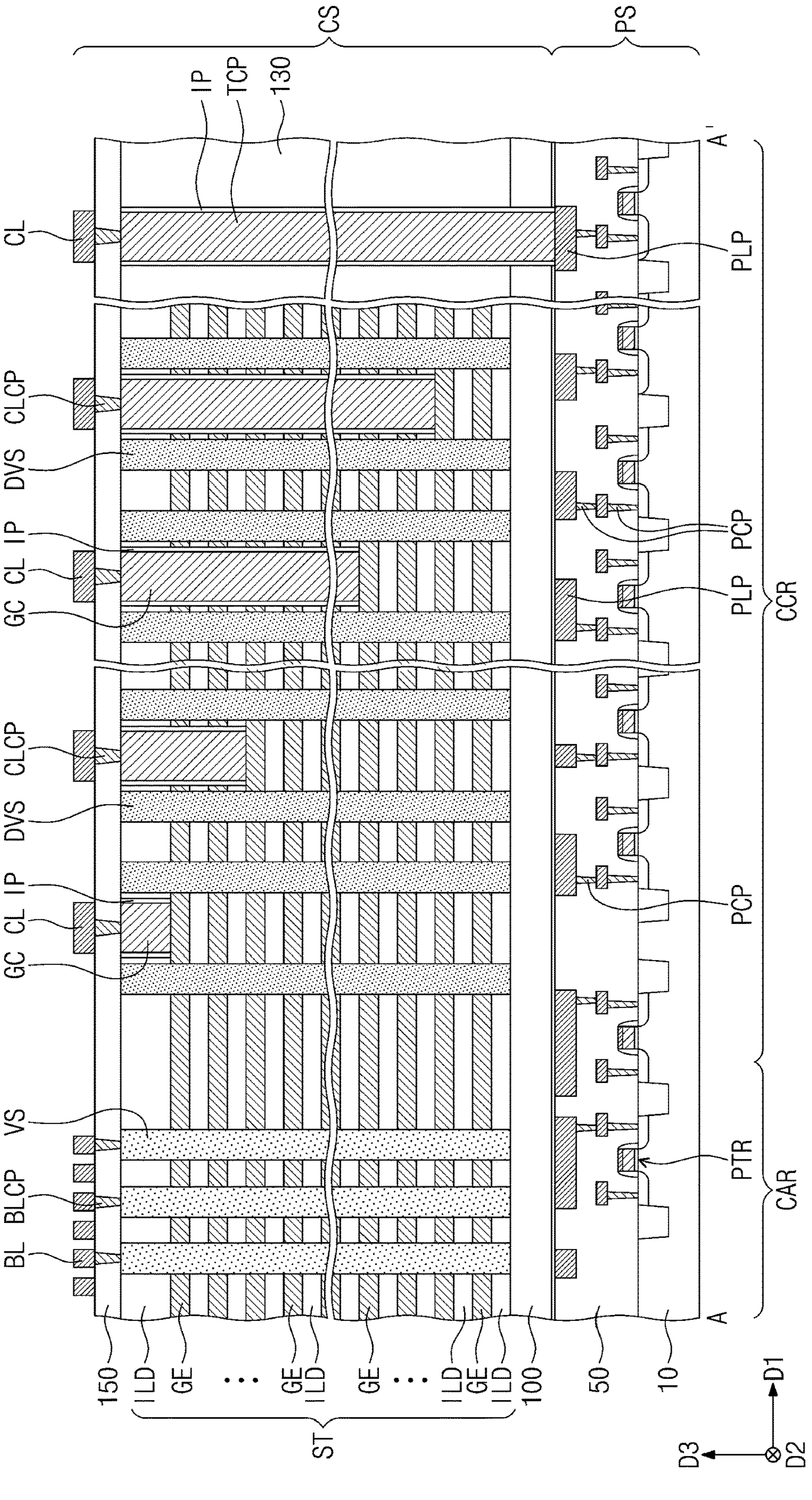
Figure 14:
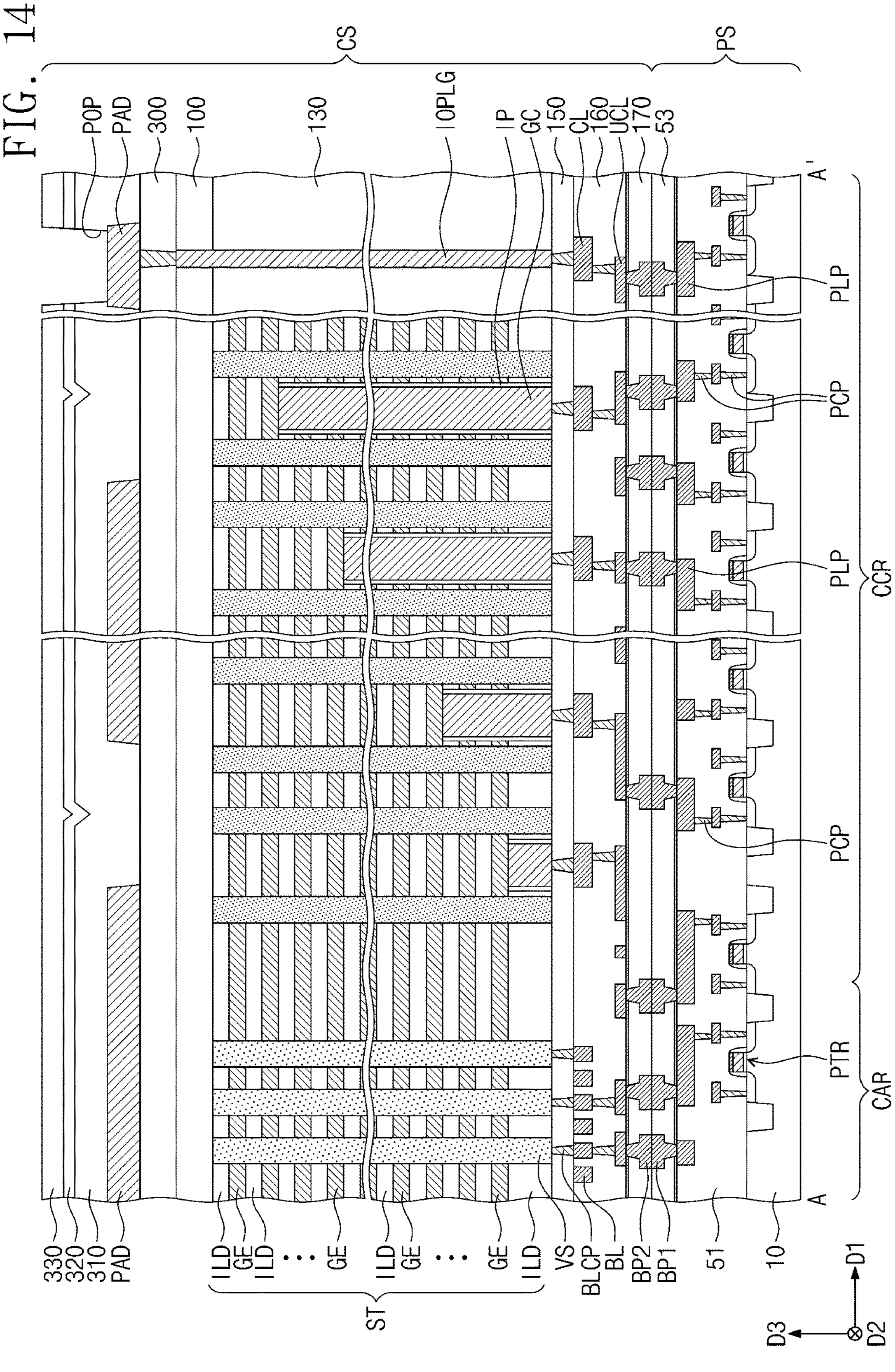

FIGS. 12 to 14 illustrate example cross-sectional views taken along line A-A' of FIG. 5.

Referring to FIG. 12, the stack structure ST may include pad portions ELp on the connection region CCR. For example, the gate electrodes GE of the stack structure ST may have the pad portions ELp on the connection region CCR. The pad portions ELp of the gate electrodes GE may be provided at positions that are horizontally and vertically different from each other. For example, the pad portions ELp of the gate electrodes GE may be located at levels that are different in the first direction D1 and the second direction D2. The stack structure ST may thus have a stepwise structure along the first direction D1 on the connection region CCR.

An intermediate dielectric layer 130 may be provided on the connection region CCR. The intermediate dielectric layer 130 may be positioned between the stack structure ST and the first interlayer dielectric layer 150. The intermediate dielectric layer 130 may be positioned on the pad portions ELp of the gate electrodes GE, while covering the stepwise structure of the stack structure ST.

The gate contacts GC may be provided on the connection region CCR. The gate contacts GC may penetrate the intermediate dielectric layer 130 to come into connection with the gate electrodes GE. Each of the gate contacts GC may penetrate one of the dielectric layers ILD to directly contact one of the pad portions ELp of the gate electrodes GE.

Referring to FIG. 13, a three-dimensional semiconductor memory device may include a peripheral circuit structure PS and a cell array structure CS stacked on the peripheral circuit structure PS.

The peripheral circuit structure PS may include peripheral circuits PTR integrated on a front surface of a semiconductor substrate 10, peripheral circuit lines PLP, peripheral contact plugs PCP, and a lower dielectric layer 50. For example, the semiconductor substrate 10 may include a silicon substrate. The semiconductor substrate 10 may include a cell array region CAR and a connection region CCR.

The peripheral circuits PTR may correspond to the decoder circuit 1110, the page buffer 1120, and the control circuit of FIG. 1. For example, the peripheral circuits PTR may include NMOS and PMOS transistors. The peripheral circuits PTR may be electrically connected to the peripheral contact plugs PCP. The peripheral circuits PTR may be electrically connected through the peripheral contact plugs PCP to peripheral circuit lines PLP. For example, the peripheral contact plugs PCP may each have a width in the first direction D1 or the second direction D2, and the width may increase in the third direction D3. The peripheral contact plugs PCP and the peripheral circuit lines PLP may include a conductive material, such as metal.

The lower dielectric layer 50 may be provided on the semiconductor substrate 10. On the semiconductor substrate 10, the lower dielectric layer 50 may cover the peripheral circuits PTR, the peripheral contact plugs PCP, and the peripheral circuit lines PLP. The lower dielectric layer 50 may include a plurality of stacked dielectric layers. For example, the lower dielectric layer 50 may include one or more of a silicon oxide layer, a silicon nitride layer, a silicon oxynitride layer, and a low-k dielectric layer.

The cell array structure CS may be disposed on the lower dielectric layer 50. As discussed with reference to FIGS. 5 to 7, the cell array structure CS may include a substrate 100, a stack structure ST, vertical channel structures VS, dummy vertical structures DVS, gate contacts GC, bit lines BL, and connection lines CL. In addition, the cell array structure CS may further include a through contact plug TCP.

The through contact plug TCP may be provided spaced apart in the first direction D1 from the stack structure ST. The through contact plug TCP may penetrate the intermediate dielectric layer 130 and the substrate 100 to come into connection with the peripheral circuit lines PLP of the peripheral circuit structure PS. For example, the through contact plug TCP may be electrically connected to the peripheral circuits PTR through the peripheral circuit lines PLP and the peripheral contact plugs PCP. A dielectric pattern IP may be provided on a lateral surface of the through contact plug TCP, but the present disclosure is not limited thereto. For example, the dielectric pattern IP may be omitted on the lateral surface of the through contact plug TCP.

The through contact plug TCP may have a planar shape substantially the same as that of the gate contact GC. For example, likewise the gate contact GC discussed in FIGS. 5 and 9 to 11, the through contact plug TCP may have a planar shape other than a circular shape. The present disclosure, however, is not limited thereto, and the through contact plug TCP may have a circular shape when viewed in plan.

Referring to FIG. 14, a three-dimensional semiconductor memory device may have a chip-to-chip (C2C) structure. The chip-to-chip (C2C) structure may be fabricated by forming on a first wafer an upper chip including a cell array structure CS, forming on a second wafer different from the first wafer a lower chip including a peripheral circuit structure PS, and then using a bonding method to connect the upper and lower chips to each other. For example, the bonding method may indicate a way of electrically connecting a bonding metal formed on an uppermost metal layer of the upper chip to a bonding metal formed on an uppermost metal layer of the lower chip. When the bonding metal is formed of copper (Cu), the bonding method may be a Cu-to-Cu bonding method, and the bonding metal may be formed of aluminum (Al) or tungsten (W).

A three-dimensional semiconductor memory device may include a peripheral circuit structure PS and a cell array structure CS stacked on the peripheral circuit structure PS. As the cell array structure CS is bonded onto the peripheral circuit structure PS, it may be possible to increase a cell capacity per unit area of the semiconductor device according to the present disclosure. In addition, the peripheral circuit structure PS and the cell array structure CS may be independently fabricated and connected to each other, and thus peripheral circuits PTR may be prevented from being damaged due to various annealing processes. In conclusion, the three-dimensional semiconductor memory device may improve in reliability and electrical properties.

The peripheral circuit structure PS may include a semiconductor substrate 10, peripheral circuits PTR controlling a memory cell array, peripheral circuit lines PLP, peripheral contact plugs PCP, and lower dielectric layers 51 and 53 on the semiconductor substrate 10. The peripheral circuits PTR may be integrated on a top surface of the semiconductor substrate 10.

The lower dielectric layers 51 and 53 may be provided on the top surface of the semiconductor substrate 10. The lower dielectric layers 51 and 53 may include a first lower dielectric layer 51 and a second lower dielectric layer 53. On the semiconductor substrate 10, the first lower dielectric layer 51 may cover the peripheral circuits PTR, the peripheral contact plugs PCP, and the peripheral circuit lines PLP. The second lower dielectric layer 53 may be positioned on and cover the first lower dielectric layer 51. An etch stop layer may be provided between the second lower dielectric layer 53 and the first lower dielectric layer 51. For example, the lower dielectric layers 51 and 53 may include one or more of silicon oxide, silicon nitride, silicon oxynitride, and low-k dielectrics.

The second lower dielectric layer 53 may be provided with first bonding pads BP1 therein. The second lower dielectric layer 53 may not cover top surfaces of the first bonding pads BP1. For example, a top surface of the second lower dielectric layer 53 may be substantially coplanar with those of the first bonding pads BP1. The first bonding pads BP1 may be electrically connected to the peripheral circuits PTR through the peripheral circuit lines PLP and the peripheral contact plugs PCP.

The cell array structure CS may be provided on the peripheral circuit structure PS. The cell array structure CS may include a memory cell array including memory cells that are three-dimensionally arranged on a substrate 100. As discussed with reference to FIGS. 5 to 7, the cell array structure CS may include a stack structure ST, vertical channel structures VS, dummy vertical structures DVS, gate contacts GC, bit lines BL, and connection lines CL. In addition, the cell array structure CS may further include an input/output contact plug IOPLG, an upper dielectric layer 300, capping dielectric layers 310 and 320, and a passivation layer 330.

A second interlayer dielectric layer 160 may be provided which is positioned on a first interlayer dielectric layer 150 and covers the bit lines BL and the connection lines CL. The second interlayer dielectric layer 160 may be provided with upper conductive lines UCL therein. The upper conductive lines UCL may be electrically connected to the bit lines BL or the connection lines CL. A third interlayer dielectric layer 170 may be provided on the second interlayer dielectric layer 160. For example, the first, second, and third interlayer dielectric layers 150, 160, and 170 may include one or more of silicon oxide, silicon nitride, silicon oxynitride, and low-k dielectrics.

The third interlayer dielectric layer 170 may be provided with second bonding pads BP2 therein. The second bonding pads BP2 may be electrically connected to the upper conductive lines UCL. A hybrid bonding method may be used to electrically and physically connect the second bonding pads BP2 to the first bonding pads BP1. In this description, the term "hybrid bonding" may denote a bonding in which two components of the same kind are merged at an interface therebetween. For example, the first bonding pad BP1 and the second bonding pad BP2 that are bonded to each other may have a continuous configuration, and an invisible interface may be present between the first bonding pad BP1 and the second bonding pad BP2. The first bonding pad BP1 and the second bonding pad BP2 may be connected into a single unitary piece.

The upper dielectric layer 300 may be provided on and cover the substrate 100. Input/output pads PAD may be provided on the upper dielectric layer 300. The capping dielectric layers 310 and 320 and the passivation layer 330 may be sequentially provided on the upper dielectric layer 300. The capping dielectric layers 310 and 320 may cover the input/output pads PAD. The capping dielectric layers 310 and 310 and the passivation layer 330 may have a pad opening POP that expose a portion of the input/output pad PAD. For example, the capping dielectric layers 310 and 320 may include silicon nitride or silicon oxynitride, and the passivation layer 330 may include a polyimide-based material such as photosensitive polyimide (PSPI).

The input/output contact plug IOPLG may be provided on the connection region CCR. The input/output contact plug IOPLG may penetrate an intermediate dielectric layer 130 and the substrate 100 to come into electrical connection with one of the input/output pads PAD.

FIGS. 15A to 19C illustrate diagrams showing an example of a method of fabricating a three-dimensional semiconductor memory device. FIGS. 15A, 16A, 17A, 18A, and 19A correspond to plan views of a three-dimensional semiconductor memory device. FIGS. 15B, 16B, 17B, 18B, and 19B are cross-sectional views taken along line A-A' of FIGS. 15A, 16A, 17A, 18A, and 19A, respectively. FIGS. 15C, 16C, 17C, 18C, and 19C are cross-sectional views taken along line B-B' of FIGS. 15A, 16A, 17A, 18A, and 19A, respectively.

Figure 15A:
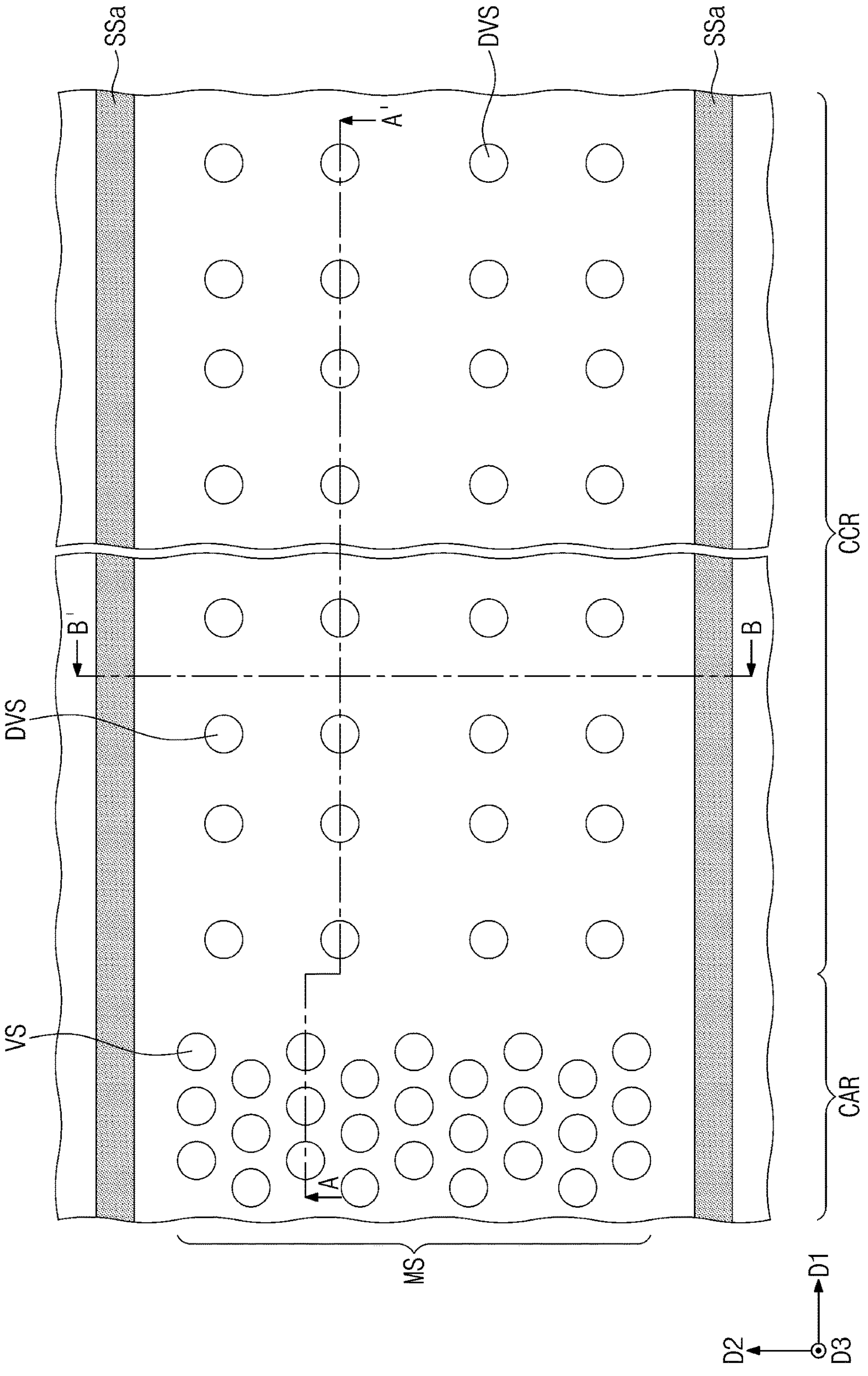
FIGS. 15A to 19C illustrate diagrams showing an example of a method of fabricating a three-dimensional semiconductor memory device.
Figure 15B:
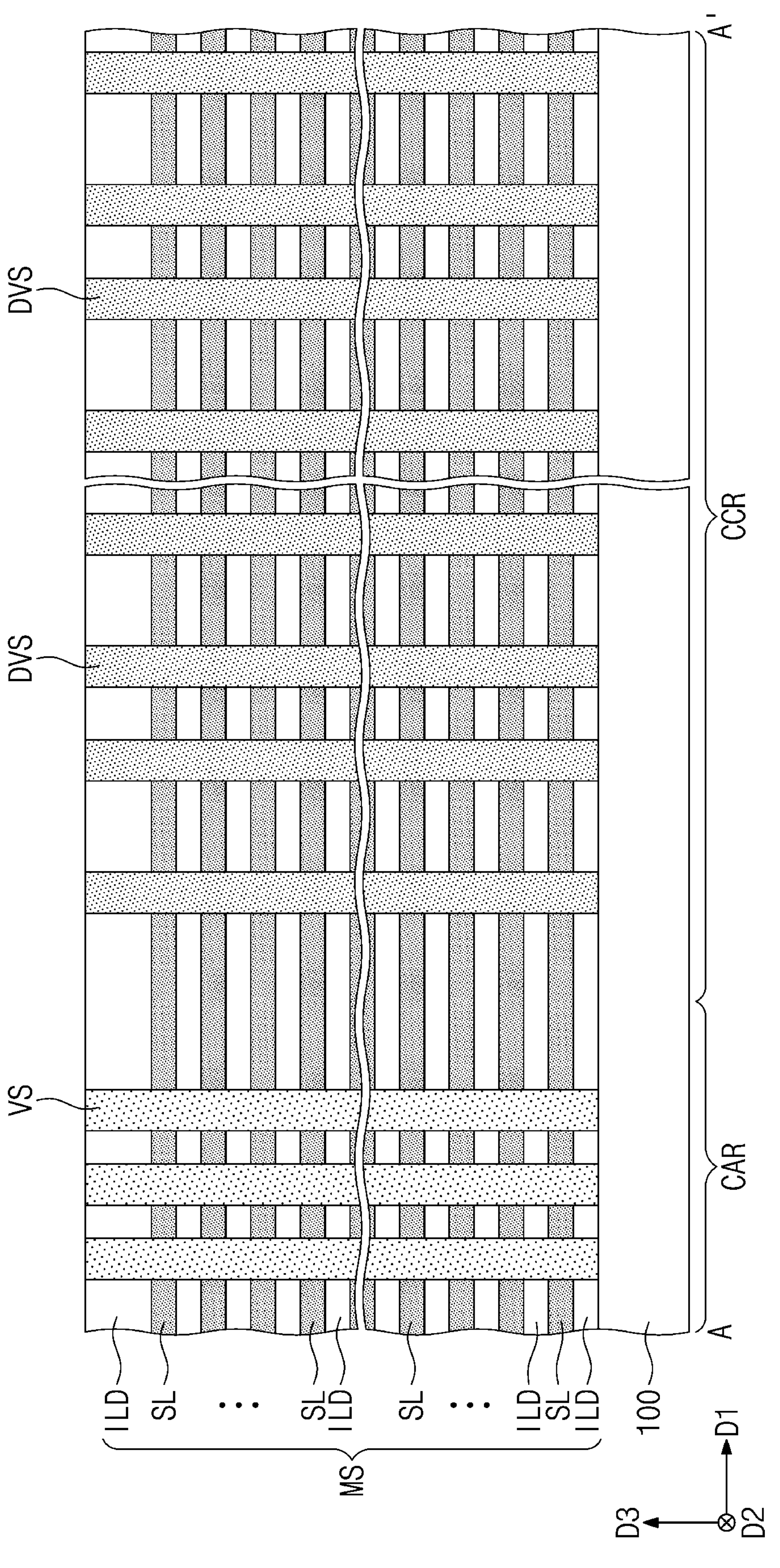
Figure 15C:
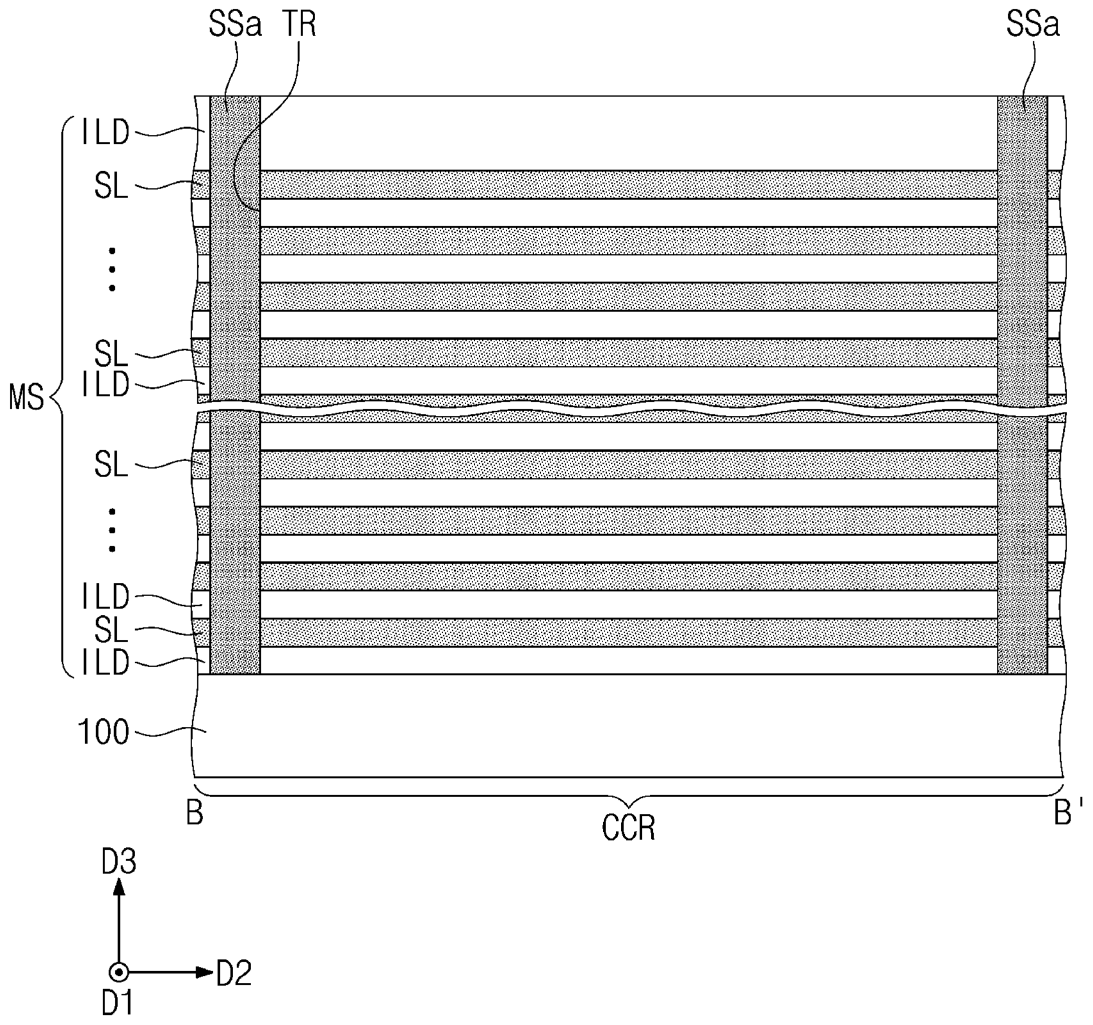

Referring to FIGS. 15A, 15B, and 15C, a substrate 100 may include a cell array region CAR and a connection region CCR that is adjacent to the cell array region CAR and extends in a first direction D1.

The substrate 100 may include, for example, at least one selected from silicon (Si), germanium (Ge), silicon germanium (SiGe), gallium arsenic (GaAs), indium gallium arsenic (InGaAs), aluminum gallium arsenic (AlGaAs), and a mixture thereof. The substrate 100 may include one or more of a semiconductor doped with impurities and an intrinsic semiconductor with no doped impurities. The substrate 100 may have at least one selected from a monocrystalline structure, an amorphous structure, and a polycrystalline structure.

Dielectric layers ILD and sacrificial layers SL may be alternately stacked in a third direction D3 on the substrate 100, thereby forming a mold structure MS. The mold structure MS may have a uniform thickness on the cell array region CAR and the connection region CCR. The sacrificial layers SL may have substantially the same thickness, and one or more of the dielectric layers ILD may have different thicknesses. For example, an uppermost one of the dielectric layers ILD may have a thickness greater those of other dielectric layers ILD.

The sacrificial layers SL of the mold structure MS may include a material having an etch selectivity with respect to the dielectric layers ILD of the mold structure MS. For example, the sacrificial layers SL may include silicon nitride, and the dielectric layers ILD may include silicon oxide. The sacrificial layers SL and the dielectric layers ILD may include different dielectric materials from each other.

The dielectric layers ILD and the sacrificial layers SL may be formed on the substrate 100 by using thermal chemical vapor deposition (CVD), plasma enhanced CVD, physical CVD process, or atomic layer deposition (ALD).

On the cell array region CAR, vertical channel structures VS may be formed in vertical channel holes that penetrate the mold structure MS. The formation of the vertical channel holes may include forming a hardmask pattern on the mold structure MS, and using the hardmask pattern as an etching mask to perform an anisotropic etching process to form the vertical channel holes in the mold structure MS. In the anisotropic etching process for forming the vertical channel holes, the substrate 100 may be over-etched to a top surface thereof. Thus, the top surface of the substrate 100 exposed to the vertical channel holes may be recessed to a certain depth.

The formation of the vertical channel structures VS may include sequentially depositing a data storage layer and a vertical channel layer in the vertical channel holes, and etching and planarizing the data storage layer and the vertical channel layer. Therefore, vertical channel structures VS may be formed each of which includes a data storage pattern DSP, a vertical semiconductor pattern VP, and a gap-fill dielectric pattern VI of FIG. 8A.

On the connection region CCR, dummy vertical structures DVS may be formed in vertical dummy holes that penetrate the mold structure MS. The formation of the vertical dummy holes may be substantially the same as the formation of the vertical channel holes. The vertical dummy holes may be formed simultaneously with the vertical channel holes, but the present disclosure is not limited thereto. The formation of the dummy vertical structures DVS may include filling the vertical dummy holes with a dielectric material and planarizing the dielectric material.

On the cell array region CAR and the connection region CCR, trenches TR may be formed to penetrate the mold structure MS. The formation of the trenches TR may include forming a mask pattern on the mold structure MS, and using the mask pattern to perform an anisotropic etching process to remove a portion of the mold structure MS. Each of trenches TR may extend in the first direction D1 and may be spaced apart from each other in a second direction D2. The trenches TR may partially expose the top surface of the substrate 100.

Preliminary separation structures SSa may be formed in the trenches TR. The formation of the preliminary separation structures SSa may include performing a planarization process. Thus, top surfaces of the preliminary separation structures SSa may be coplanar with that of the uppermost one of the dielectric layers ILD. The preliminary separation structures SSa may include a material having an etch selectivity with respect to the dielectric layers ILD and the sacrificial layers SL. For example, the preliminary separation structures SSa may include polycrystalline silicon.

Figure 16A:
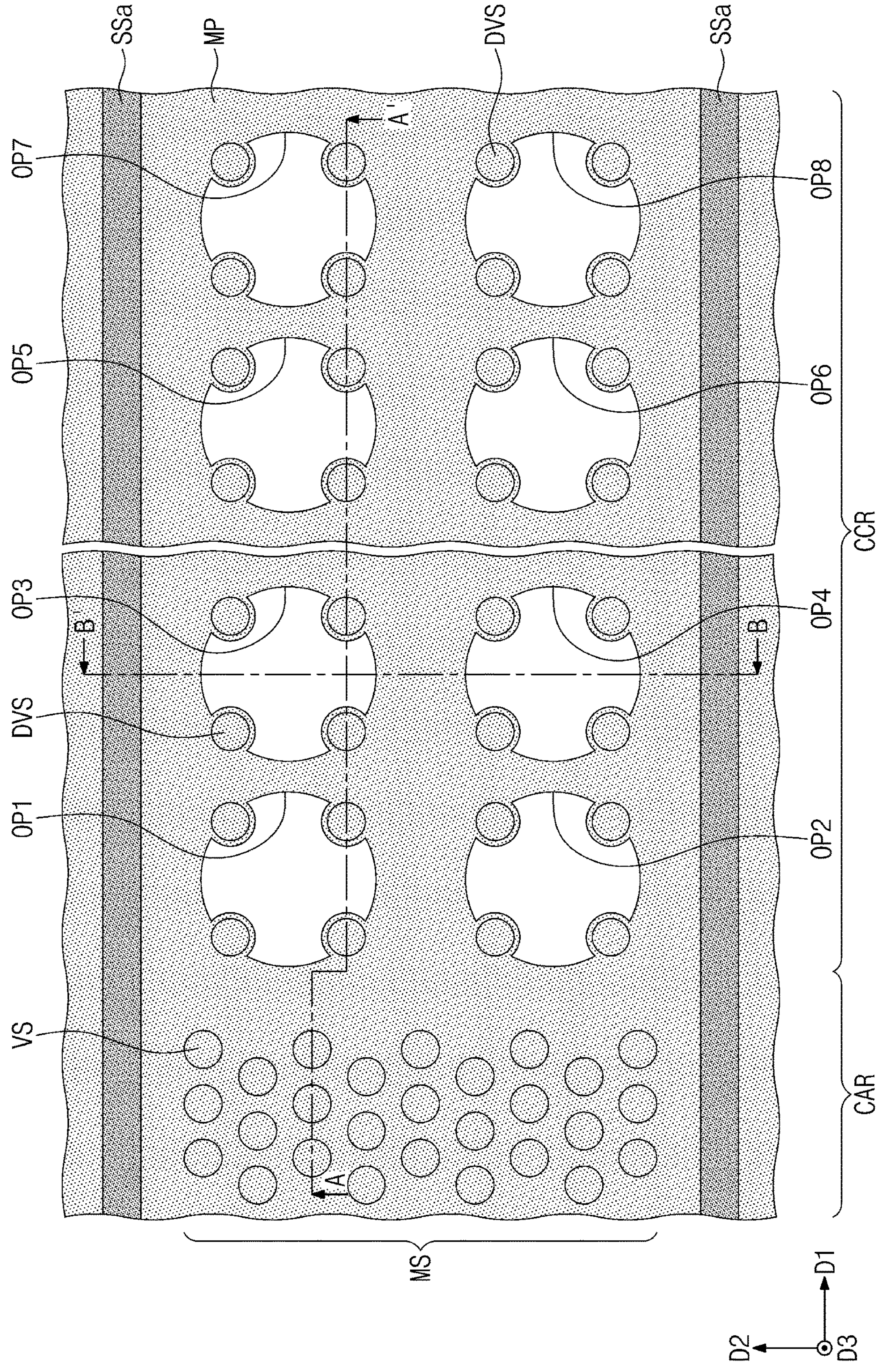
Figure 16B:
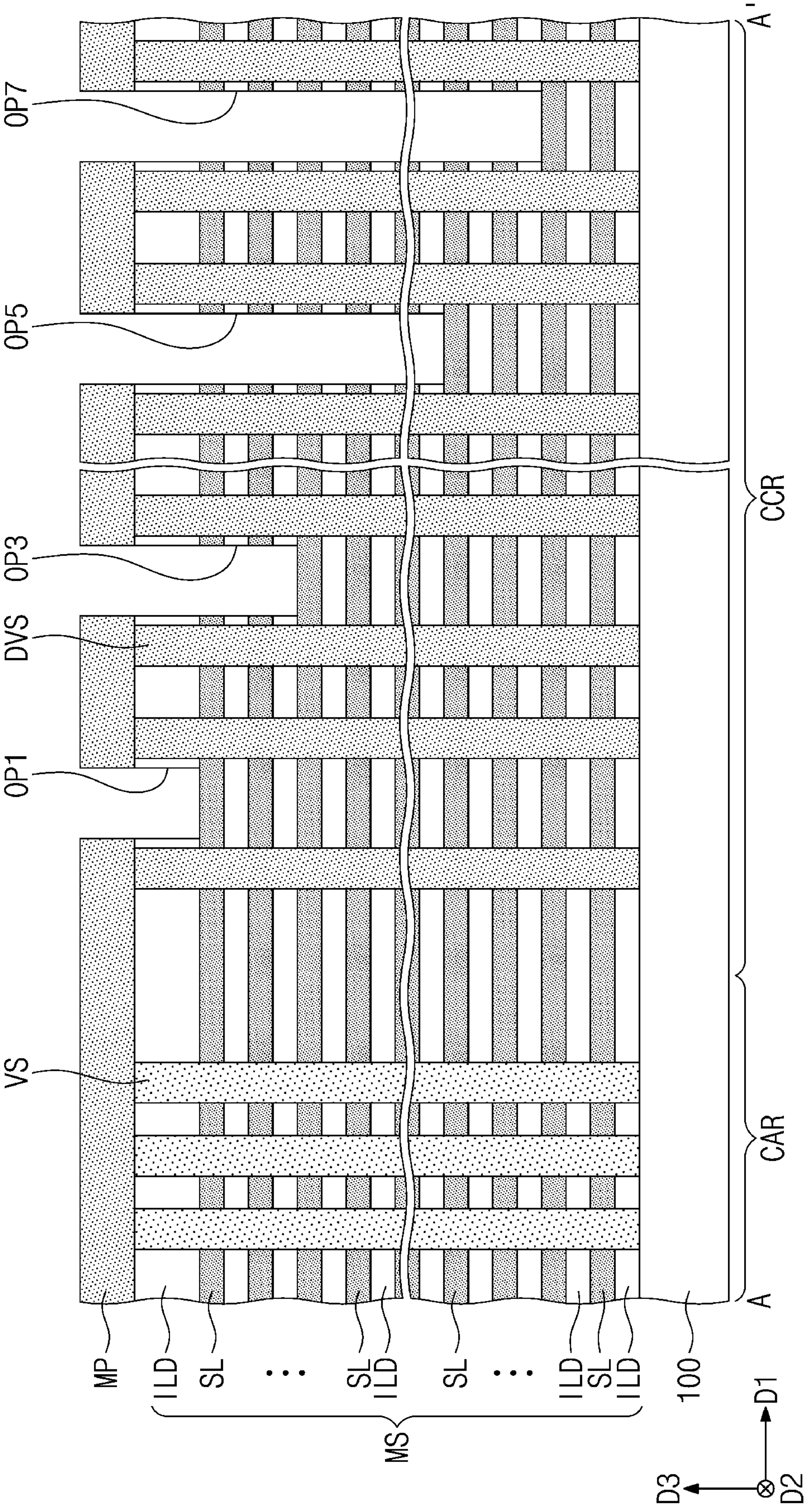
Figure 16C:
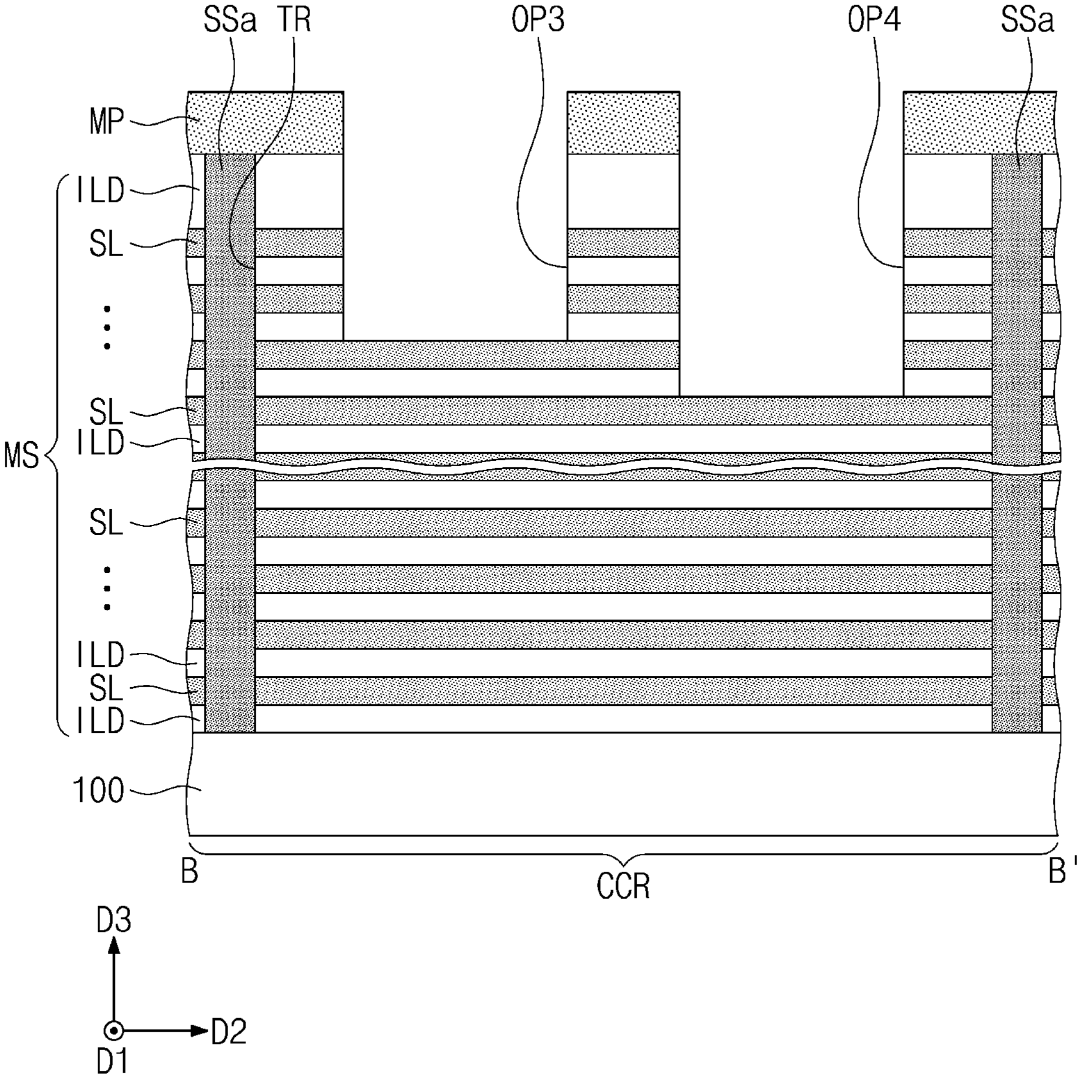

Referring to FIGS. 16A, 16B, and 16C, on the connection region CCR, contact holes OP1, OP2, OP3, OP4, OP5, OP6, OP7, and OP8 may be formed to penetrate a portion of the mold structure MS. The formation of the contact holes OP1, OP2, OP3, OP4, OP5, OP6, OP7, and OP8 may include forming a mask pattern MP, and using the mask pattern MP to perform an etching process to remove a portion of the mold structure MS. On the mold structure MS, the mask pattern MP may cover the dummy vertical structures DVS, while exposing the contact holes OP1, OP2, OP3, OP4, OP5, OP6, OP7, and OP8. Thus, the etching process may not etch the dummy vertical structures DVS.

The contact holes OP1, OP2, OP3, OP4, OP5, OP6, OP7, and OP8 may expose the sacrificial layers SL located at different levels. For example, the contact holes OP1, OP2, OP3, OP4, OP5, OP6, OP7, and OP8 may have different vertical depths, and the vertical depths of the contact holes OP1, OP2, OP3, OP4, OP5, OP6, OP7, and OP8 may depend on a frequency of forming the mask pattern MP and performing the etching process.

The contact holes OP1, OP2, OP3, OP4, OP5, OP6, OP7, and OP8 may expose sidewalls of some of the sacrificial layers SL and sidewalls of some of the dielectric layers ILD. The contact holes OP1, OP2, OP3, OP4, OP5, OP6, OP7, and OP8 may be formed adjacent to the dummy vertical structures DVS. For example, each of the contact holes OP1, OP2, OP3, OP4, OP5, OP6, OP7, and OP8 may be formed adjacent to four dummy vertical structures DVS.

When viewed in plan, the mask pattern MP may be provided in various shapes. Thus, the contact holes OP1, OP2, OP3, OP4, OP5, OP6, OP7, and OP8 may have various planar shapes. Therefore, gate contacts GC which will be discussed below may be provided in various shapes as discussed with reference to FIGS. 9 to 11. The contact holes OP1, OP2, OP3, OP4, OP5, OP6, OP7, and OP8 may have different shapes from each other.

Figure 17A:
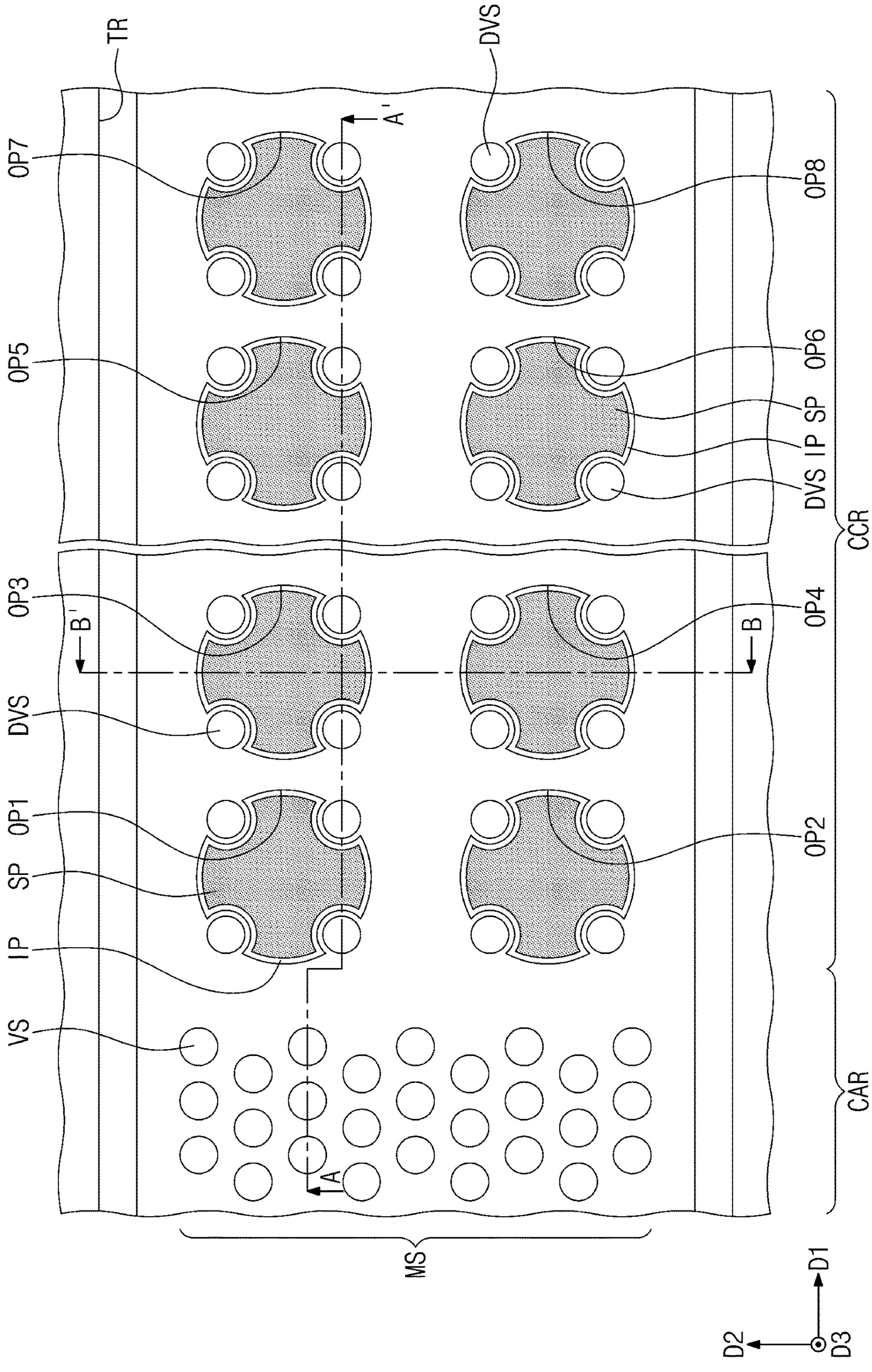
Figure 17B:
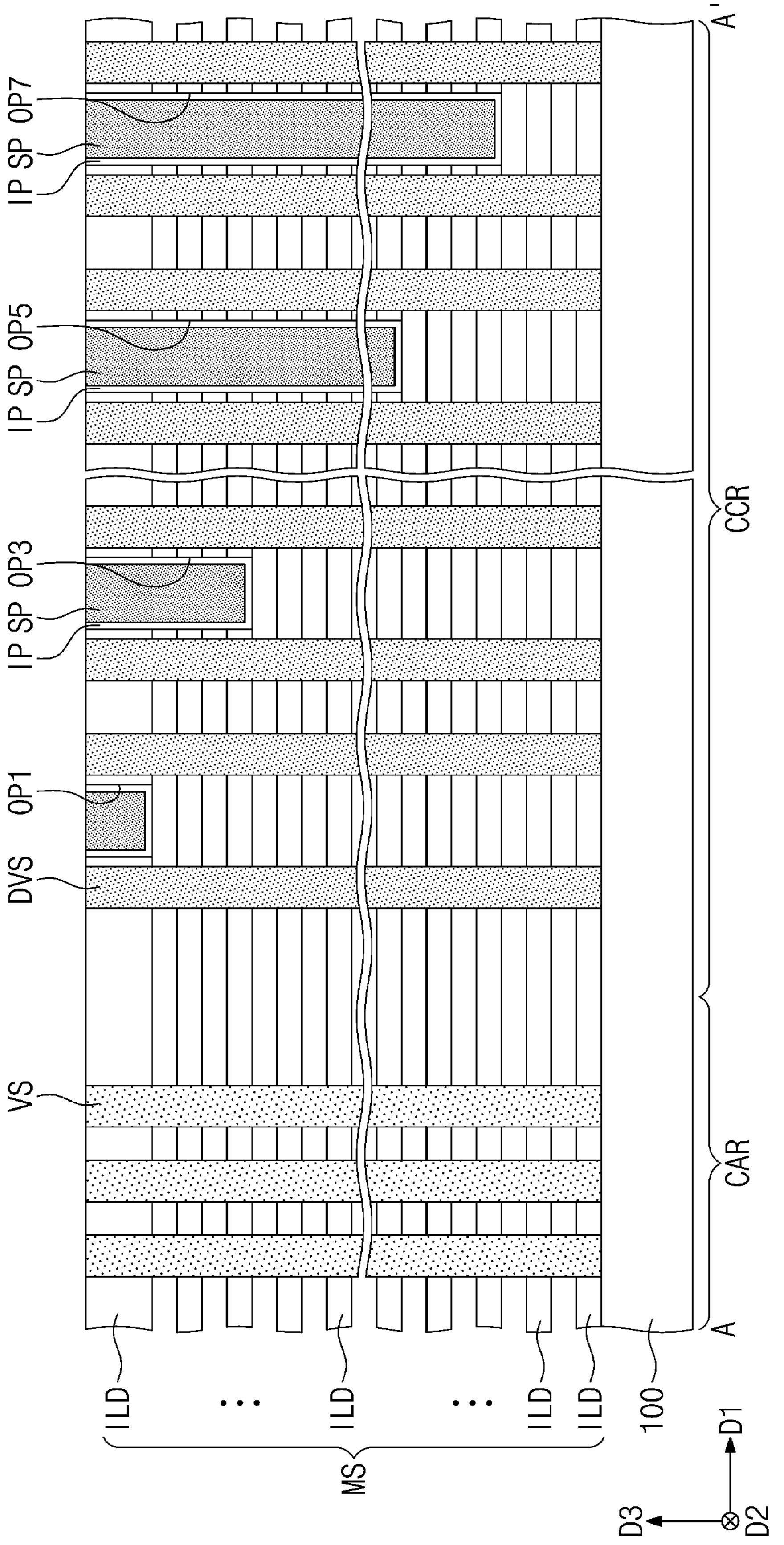
Figure 17C:
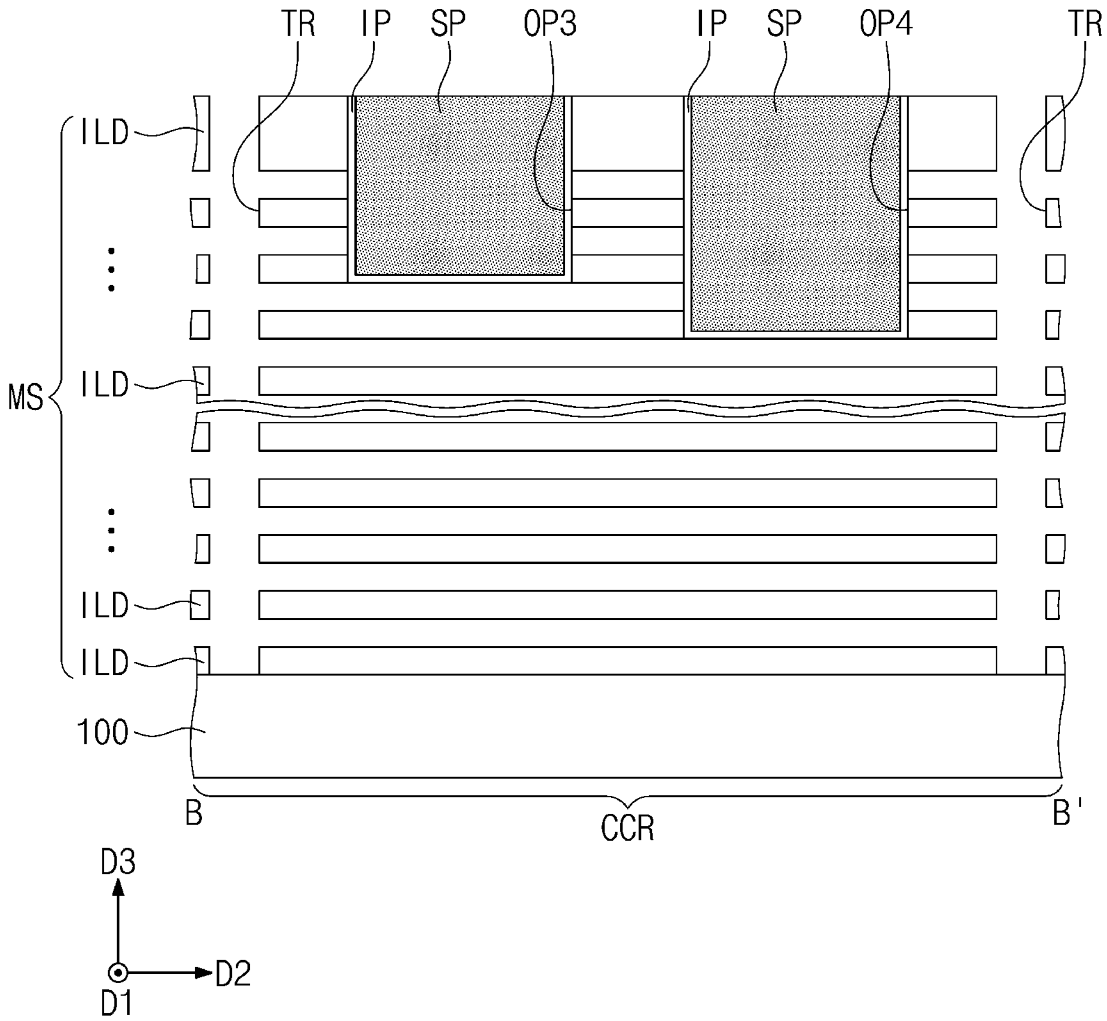

Referring to FIGS. 17A, 17B, and 17C, dielectric patterns IP may be formed to have their uniform thicknesses that cover inner walls of the contact holes OP1, OP2, OP3, OP4, OP5, OP6, OP7, and OP8. The dielectric patterns IP may be formed by chemical vapor deposition (CVD) or atomic layer deposition (ALD). The dielectric patterns IP may cover sidewalls of the sacrificial layers SL and the dielectric layers ILD exposed to the contact holes OP1, OP2, OP3, OP4, OP5, OP6, OP7, and OP8. As the contact holes OP1, OP2, OP3, OP4, OP5, OP6, OP7, and OP8 have different vertical depths from each other, the dielectric patterns IP may have different vertical lengths from each other.

The dielectric patterns IP may include a dielectric material having an etch selectivity with respect to the sacrificial layers SL. For example, the dielectric patterns IP may include one or more of silicon oxide, silicon oxynitride, and low-k dielectrics.

Sacrificial patterns SP may be formed on the dielectric patterns IP. The formation of the sacrificial patterns SP may include filling the contact holes OP1, OP2, OP3, OP4, OP5, OP6, OP7, and OP8 with a sacrificial material, and performing a planarization process on the sacrificial material. Thus, top surfaces of the sacrificial patterns SP may be coplanar with that of the uppermost one of the dielectric layers ILD. The sacrificial patterns SP may include a material having an etch selectivity with respect to the dielectric patterns IP. For example, the sacrificial patterns SP may include silicon nitride.

The preliminary separation structures SSa may be removed. Therefore, the trenches TR may be outwardly exposed. The preliminary separation structures SSa may be selectively removed by performing an etching process that uses an etchant including a phosphoric acid.

After the removal of the preliminary separation structures SSa, the sacrificial layers SL exposed by the trenches TR may be selectively removed. The selective removal of the sacrificial layers SL may be achieved by a wet etching process that uses an etching solution having an etch selectivity. The selective removal of the sacrificial layers SL may cause structural vulnerability of the mold structure MS. Thus, the mold structure MS may be collapsed or tilted. In this case, as the mold structure MS is supported by the vertical channel structures VS, the dummy vertical structures DVS, and the sacrificial patterns SP, the mold structure MS may be supported in the middle of forming gate electrodes GE which will be discussed.

Figure 18A:
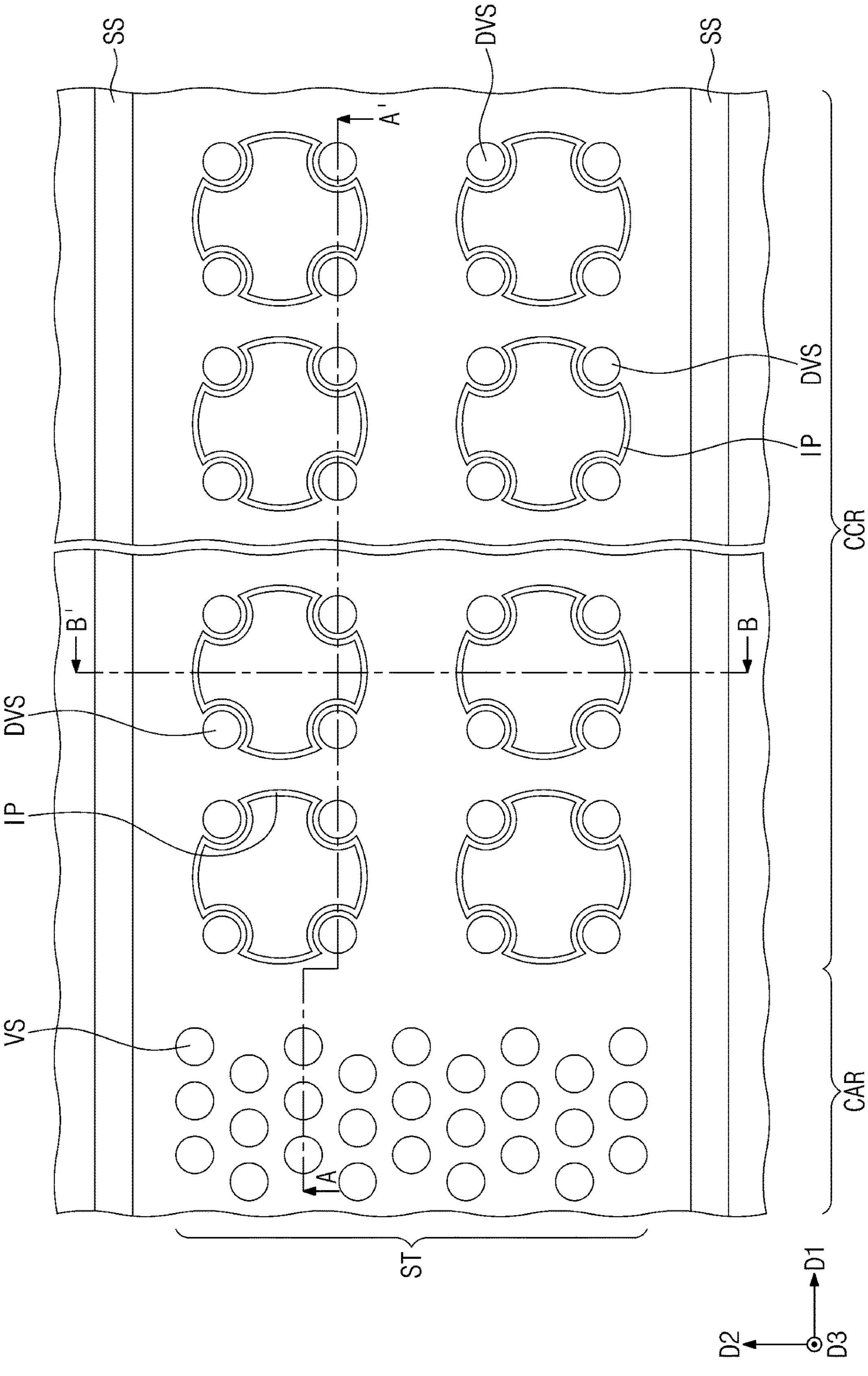
Figure 18B:
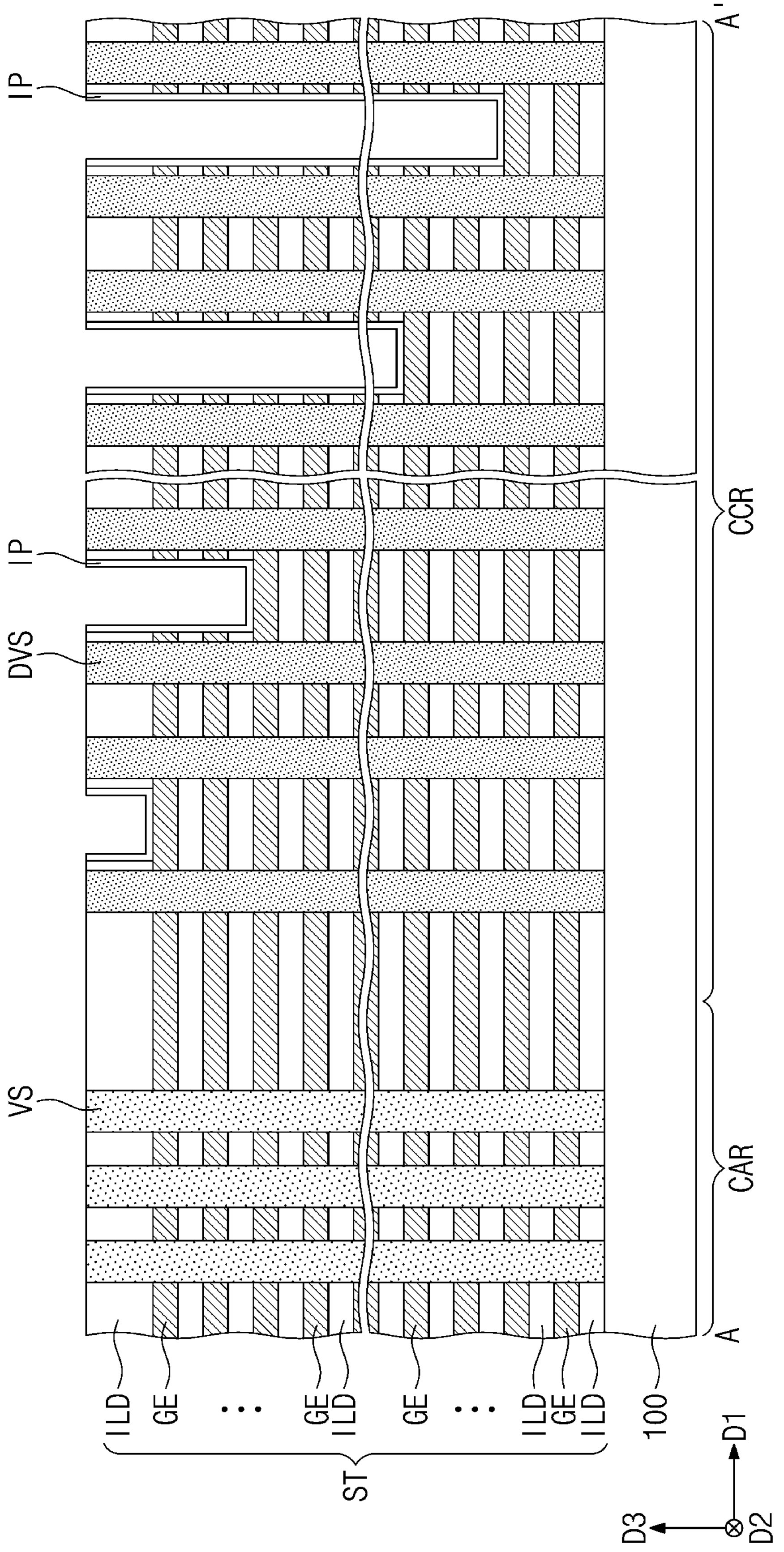
Figure 18C:
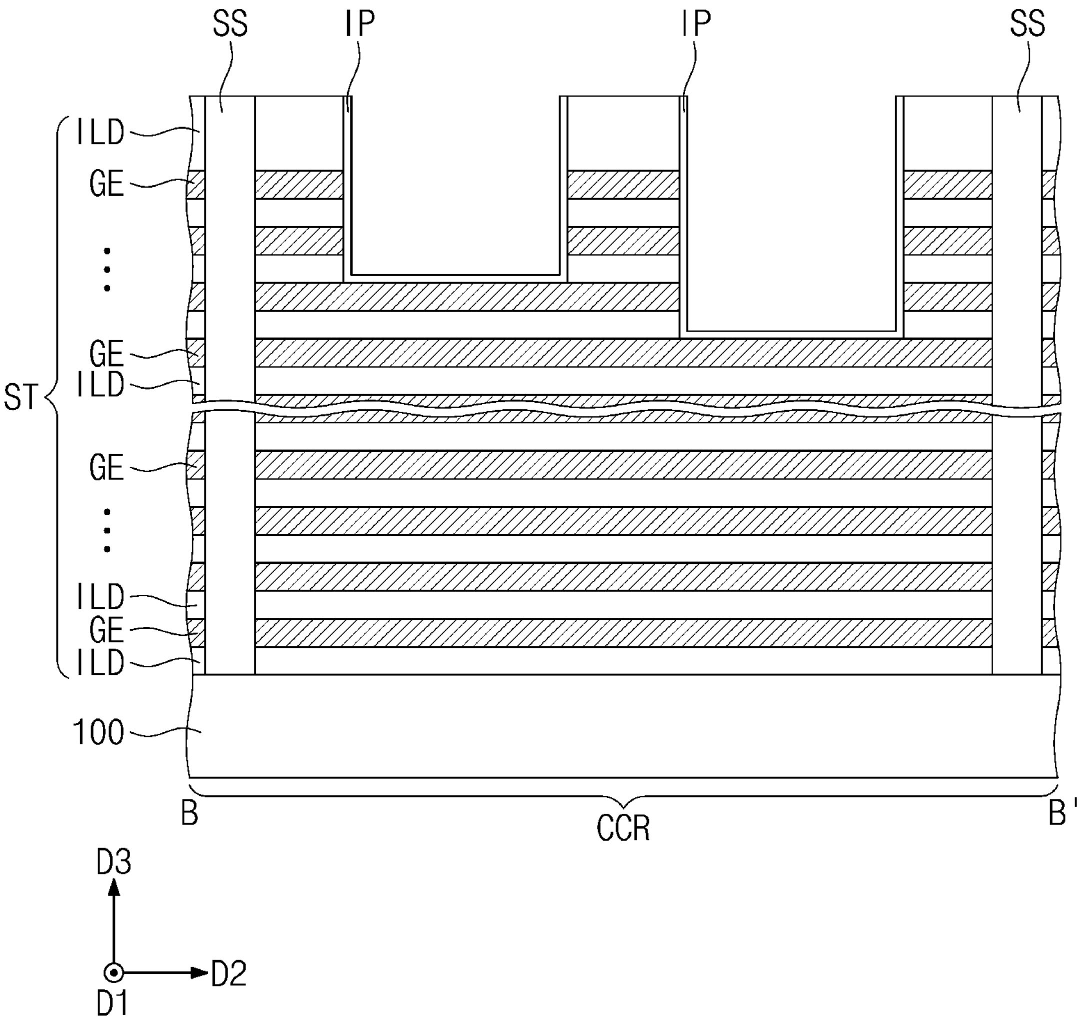

Referring to FIGS. 18A, 18B, and 18C, gate electrodes GE may be formed in spaces where the sacrificial layers SL are removed. The gate electrodes GE may partially or completely fill the space where the sacrificial layers SL are removed. For example, the formation of the gate electrodes GE may include sequentially depositing a metal nitride layer (e.g., TiN, TaN, or WN) and a metal layer (e.g., W, Al, Ti, Ta, Co, or Cu). Thus, a stack structure ST may be formed which includes the gate electrodes GE and the dielectric layers ILD that are alternately stacked on the substrate 100.

Before the formation of the gate electrodes GE, a horizontal dielectric pattern HP may further be formed. As discussed with reference to FIGS. 8A and 8B, the horizontal dielectric pattern HP may have a uniform thickness to cover surfaces of the dielectric layers ILD, the vertical channel structures VS, and the dummy vertical structures DVS that are exposed in the space where the sacrificial layers SL are removed.

After the formation of the stack structure ST, separation structures SS may be formed in the trenches TR. The formation of the separation structures SS may include filling the trenches TR with a dielectric material, and allowing the dielectric material to undergo a planarization process to expose the top surface of the uppermost one of the dielectric layers ILD. The separation structures SS may be formed by one or more of chemical vapor deposition and atomic layer deposition, and a high aspect ratio of the trench TR may be caused to form a void in the separation structure SS. The separation structures SS may include at least one selected from silicon oxide, silicon nitride, silicon oxynitride, and low-k dielectrics.

The sacrificial patterns SP may be removed. Thus, inner walls of the dielectric patterns IP may be exposed. The removal of the sacrificial patterns SP may be performed by a wet etching process that uses an etching solution having an etch selectivity. As the sacrificial patterns SP include a material having an etch selectivity with respect to the dielectric patterns IP, the sacrificial patterns SP may be selectively removed while leaving the dielectric patterns IP. The removal of the sacrificial patterns SP may be substantially the same as the removal of the sacrificial layers SL of the mold structure MS.

Figure 19A:
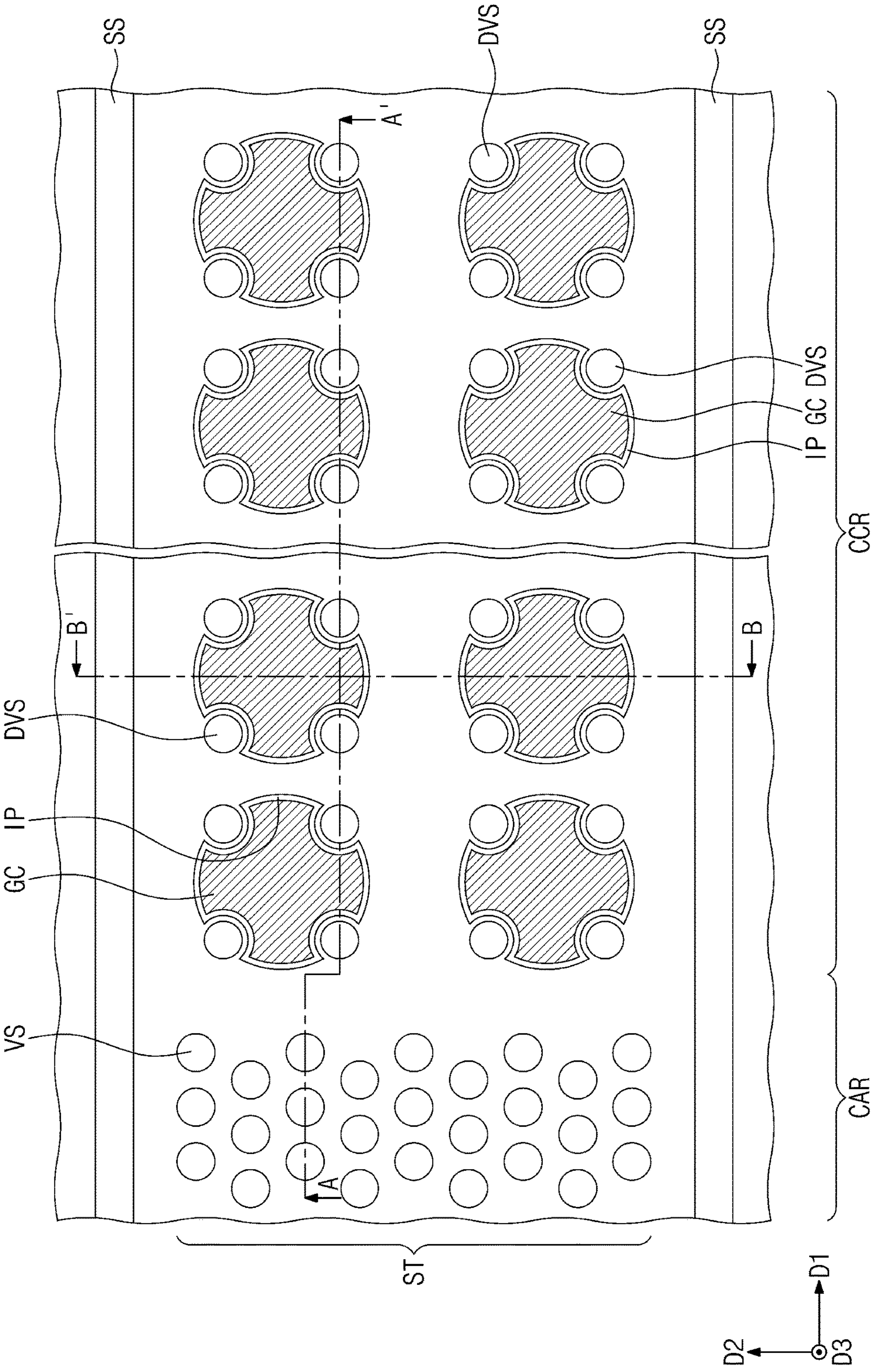
Figure 19B:
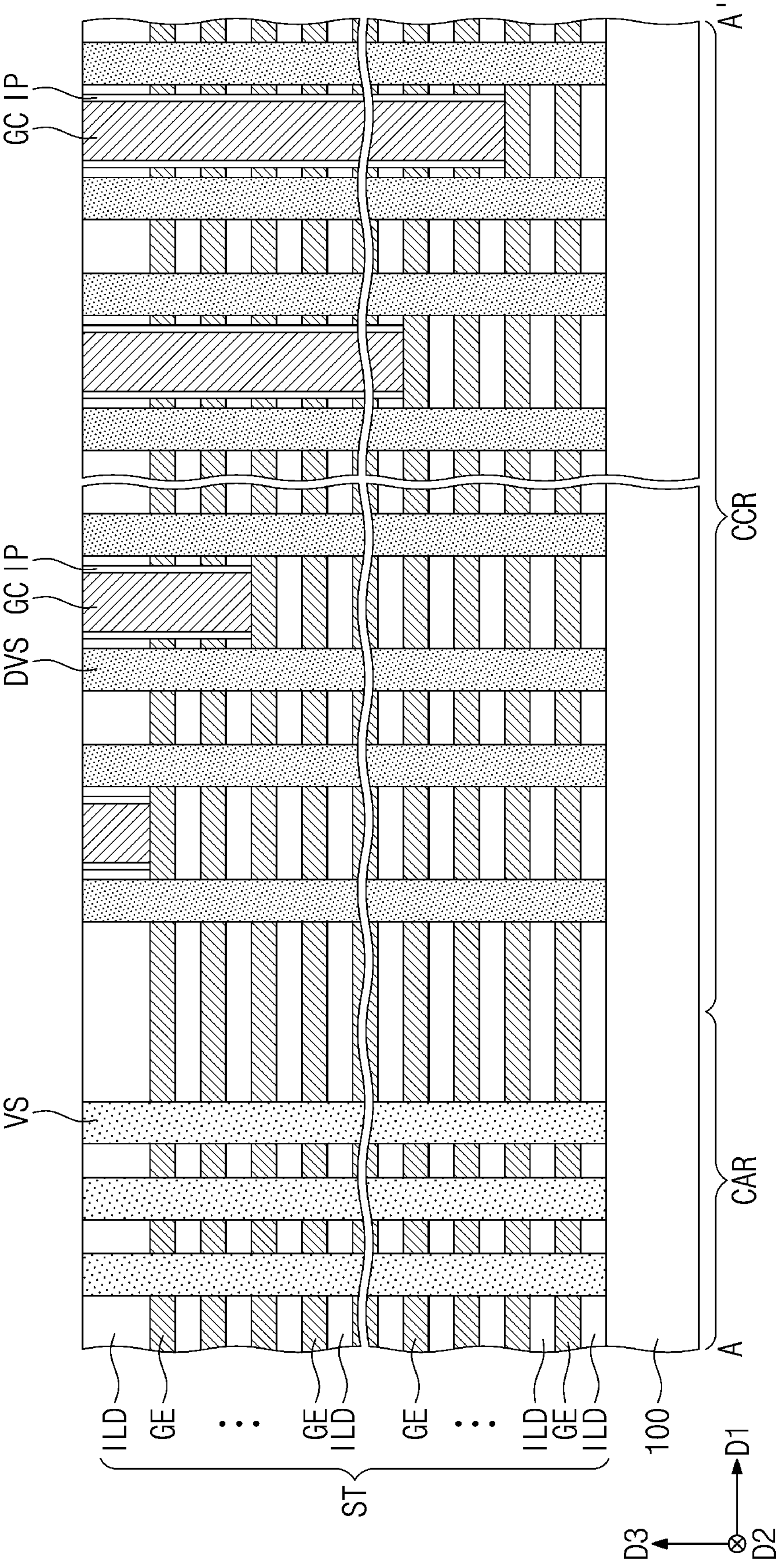
Figure 19C:
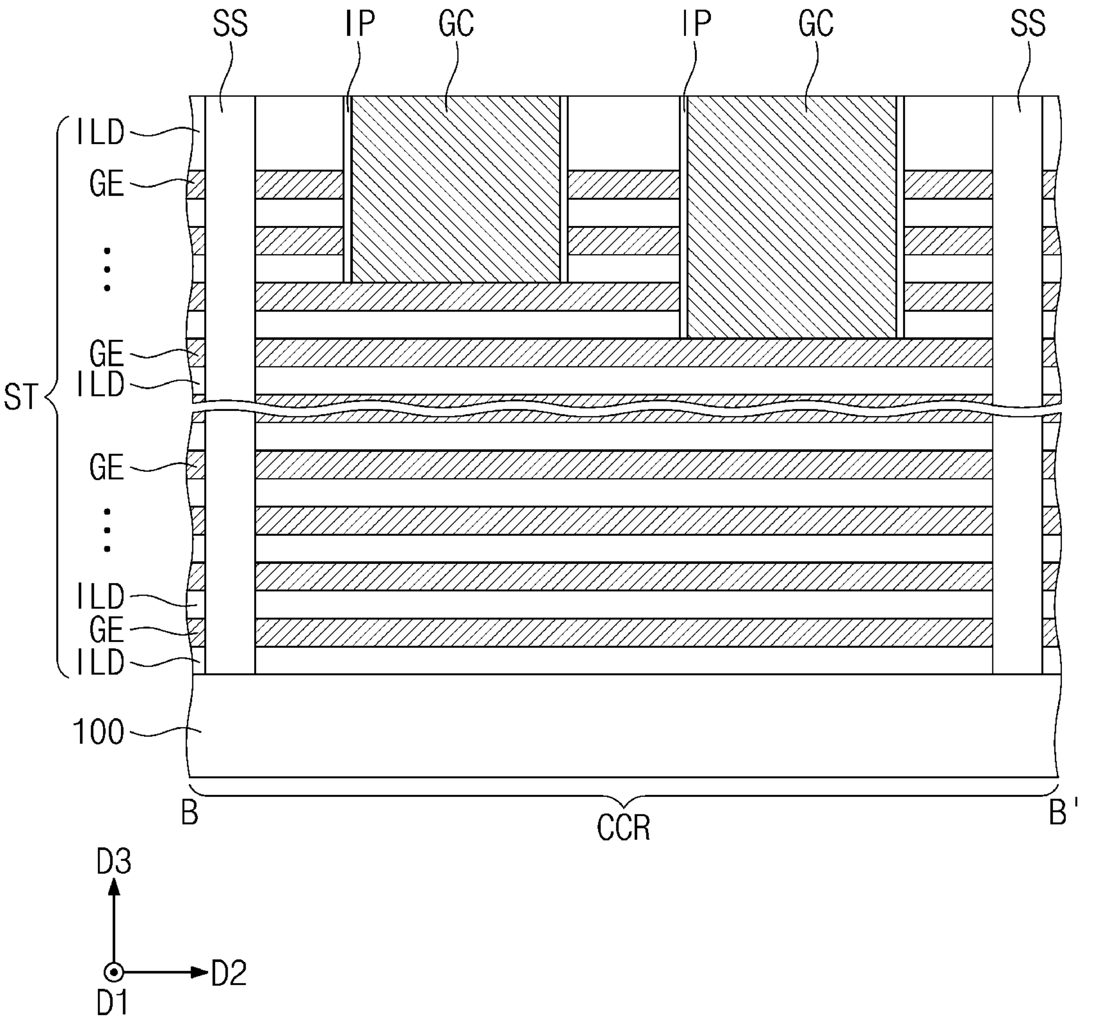

Referring to FIGS. 19A, 19B, and 19C, the stack structure ST may undergo an etch-back process to partially remove the dielectric patterns IP. For example, the etch-back process may remove portions of the dielectric patterns IP in contact with top surfaces of the gate electrodes GE. The dielectric patterns IP may be provided only on sidewalls of the gate electrodes GE and sidewalls of the dielectric layers ILD. The dielectric patterns IP may expose the top surfaces of the gate electrodes GE. In addition, the etch-back process may reduce a thickness of the uppermost of the dielectric layers ILD.

Gate contacts GC may be formed in spaces where the sacrificial patterns SP are removed. The formation of the gate contacts GC may include forming a conductive material that fills the spaces where the sacrificial patterns SP are removed, and performing a planarization process on the conductive material. Therefore, top surfaces of the gate contacts GC may be coplanar with that of the uppermost one of the dielectric layers ILD. The gate contacts GC may be in contact with the top surfaces of the gate electrodes GE. Each of the gate contacts GC may be electrically and physically connected to one of the gate electrodes GE.

Referring back to FIGS. 5, 6, and 7, a first interlayer dielectric layer 150 may be formed on the stack structure ST. The first interlayer dielectric layer 150 may have a uniform thickness to cover the stack structure ST, the vertical channel structures VS, the dummy vertical structures DVS, and the gate contacts GC.

On the cell array region CAR, bit-line contact plugs BLCP may be formed to penetrate the first interlayer dielectric layer 150 to come into connection with the vertical channel structures VS. On the connection region CCR, connection-line contact plugs CLCP may be formed to penetrate the first interlayer dielectric layer 150 to come into connection with the gate contacts GC. The bit-line contact plugs BLCP and the connection-line contact plugs CLCP may be formed simultaneously, but the present disclosure is not limited thereto.

On the cell array region CAR, bit lines BL may be formed on the first interlayer dielectric layer 150. The bit lines BL may be correspondingly connected to the bit-line contact plugs BLCP. On the connection region CCR, connection lines CL may be formed on the first interlayer dielectric layer 150. The connection lines CL may be correspondingly connected to the connection-line contact plugs CLCP. The bit lines BL and the connection lines CL may be formed simultaneously, but the present disclosure is not limited thereto.

A three-dimensional semiconductor memory device may include a gate contact adjacent to dummy vertical structures. The gate contact may include a first portion and second portions that extend from the first portion to a gap between neighboring dummy vertical structures, and thus the gate contact may have an increased planar area without overlapping the dummy vertical structures. An etching process may thus be easily performed to form the gate contact. Therefore, the gate contacts may be prevented from process failure such as not-open issue, and the three-dimensional semiconductor memory device may improve in electrical properties.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Although the present disclosure has been described in connection with the implementations of the present disclosure illustrated in the accompanying drawings, it will be understood to those skilled in the art that various changes and modifications may be made without departing from the technical spirit and essential feature of the present disclosure. It therefore will be understood that the implementations described above are just illustrative but not limitative in all aspects.

What is claimed is:

1. A three-dimensional semiconductor memory device comprising:

a substrate that includes a cell array region and a connection region;

a stack structure in which a plurality of dielectric layers and a plurality of gate electrodes are alternately stacked on the substrate;

a plurality of dummy vertical structures that extend through the stack structure on the connection region; and a gate contact that extends through the stack structure on the connection region, the gate contact being electrically connected to one gate electrode of the plurality of gate electrodes, wherein the gate contact is between the plurality of dummy vertical structures in a plan view, wherein the gate contact includes:

a first portion; and a plurality of second portions, wherein each second portion of the plurality of second portions extends between two adjacent dummy vertical structures of the plurality of dummy vertical structures, wherein the stack structure extends in a first direction, and wherein a length of the plurality of dielectric layers is the same as a length of the plurality of gate electrodes in the first direction.

2. The device of claim 1, wherein two or three second portions of the plurality of second portions protrude in the first direction from the first portion, and remaining second portions of the plurality of second portions protrude in a second direction from the first portion, the second direction intersecting the first direction.

3. The device of claim 1, wherein the gate contact is spaced apart from the plurality of dummy vertical structures in a plan view.

4. The device of claim 1, wherein a maximum horizontal length of the gate contact is greater than a distance between the plurality of dummy vertical structures.

5. The device of claim 1, comprising a dielectric pattern between the plurality of dummy vertical structures and the gate contact, wherein the dielectric pattern surrounds a lateral surface of the gate contact.

6. The device of claim 5, wherein the dielectric pattern is in contact with the plurality of dummy vertical structures.

7. The device of claim 1, wherein the gate contact includes:

a plurality of first surfaces adjacent to the plurality of dummy vertical structures; and a plurality of second surfaces between the plurality of first surfaces.

8. The device of claim 7, wherein each first surface of the plurality of first surfaces has a concave shape toward an adjacent dummy vertical structure of the plurality of dummy vertical structures.

9. The device of claim 7, wherein each second surface of the plurality of second surfaces has a convex shape between two adjacent dummy vertical structures of the plurality of dummy vertical structures.

10. The device of claim 1, wherein the gate contact includes a third portion, and wherein the third portion surrounds the first portion, the plurality of second portions, and the plurality of dummy vertical structures in a plan view.

11. A three-dimensional semiconductor memory device, comprising:

a substrate that includes a cell array region and a connection region;

a stack structure that includes a plurality of dielectric layers and a plurality of gate electrodes that are alternately stacked on the substrate;

a plurality of vertical channel structures that extend through the stack structure on the cell array region;

a plurality of gate contacts that extend through the stack structure on the connection region, the plurality of gate contacts being connected to the plurality of gate electrodes, respectively;

a plurality of dummy vertical structures that extend through the stack structure on the connection region;

a plurality of dielectric patterns in contact with a plurality of sidewalls of the plurality of gate contacts;

a plurality of bit lines on the stack structure and connected to the plurality of vertical channel structures; and a plurality of conductive lines on the stack structure and connected to the plurality of gate contacts, wherein each gate contact of the plurality of gate contacts includes:

a first portion; and a plurality of second portions that protrude from the first portion, wherein two or three second portions of the plurality of second portions extend in a first direction, and wherein remaining second portions of the plurality of second portions extend in a second direction that intersects the first direction.

12. The device of claim 11, wherein the plurality of second portions of each gate contact of the plurality of gate contacts are between two adjacent dummy vertical structures of the plurality of dummy vertical structures.

13. The device of claim 11, wherein the plurality of gate contacts have different vertical lengths.

14. The device of claim 11, wherein each dielectric layer of the plurality of dielectric layers and each gate electrode of the plurality of gate electrodes extend in one direction while surrounding the plurality of gate contacts and the plurality of dummy vertical structures.

15. The device of claim 11, wherein a width of each gate contact of the plurality of gate contacts is greater than a width of each dummy vertical structure of the plurality of dummy vertical structures.

16. The device of claim 11, wherein each dielectric pattern of the plurality of dielectric patterns includes a first dielectric pattern and a second dielectric pattern, wherein the first dielectric pattern surrounds an outer lateral surface of a corresponding gate contact, and wherein the second dielectric pattern surrounds an inner lateral surface of the corresponding gate contact.

17. An electronic system comprising:

a three-dimensional semiconductor memory device including:

a substrate that includes a cell array region and a connection region, a stack structure that includes a plurality of gate electrodes stacked on the substrate, a plurality of dummy vertical structures that extend through the stack structure on the connection region, a gate contact that is adjacent to the plurality of dummy vertical structures and that extends through a portion of the stack structure, an input/output pad electrically connected to a plurality of peripheral circuits; and a controller that has electrical connection through the input/output pad with the three-dimensional semiconductor memory device and that is configured to control the three-dimensional semiconductor memory device, and a dielectric pattern that surrounds a lateral surface of the gate contact, wherein the gate contact is spaced apart from the plurality of dummy vertical structures, wherein the stack structure extends in one direction while surrounding the plurality of dummy vertical structures and the gate contact, and wherein the gate contact includes:

a first portion; and a plurality of second portions, wherein each second portion of the plurality of second portions protrudes from the first portion and extends between two adjacent dummy vertical structures of the plurality of dummy vertical structures.

18. The electronic system of claim 17, wherein the gate contact is spaced apart from the plurality of dummy vertical structures in a plan view.

* * * * *